(12) United States Patent
Naito

(10) Patent No.: US 11,043,582 B2
(45) Date of Patent: Jun. 22, 2021

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 30 days.

(21) Appl. No.: 16/697,203

(22) Filed: Nov. 27, 2019

(65) Prior Publication Data

US 2020/0098905 A1 Mar. 26, 2020

Related U.S. Application Data

(63) Continuation of application No. PCT/JP2018/045875, filed on Dec. 13, 2018.

(30) Foreign Application Priority Data

Dec. 14, 2017 (JP) .............................. JP2017-240064

(51) Int. Cl.
*H01L 29/739* (2006.01)
*H01L 27/06* (2006.01)

(52) U.S. Cl.
CPC ...... *H01L 29/7397* (2013.01); *H01L 27/0664* (2013.01)

(58) Field of Classification Search
CPC ............. H01L 29/7397; H01L 27/0664; H01L 29/1095; H01L 29/8613; H01L 29/417;
(Continued)

(56) References Cited

U.S. PATENT DOCUMENTS 10,121,892 B2   11/2018 Nishiwaki
2003/0205758 A1 11/2003 Zeng
(Continued)

FOREIGN PATENT DOCUMENTS

JP   2005045123 A   2/2005
JP   2005524975 A   8/2005
(Continued)

OTHER PUBLICATIONS

Office Action issued for counterpart Japanese Application No. 2019-559198, issued by the Japan Patent Office dated Feb. 2, 2021 (drafted on Jan. 25, 2021).
(Continued)

*Primary Examiner* — Mohammed R Alam

(57) ABSTRACT

Provided is a semiconductor device comprising: a semiconductor substrate; a gate trench section that is provided from an upper surface to an inside of the semiconductor substrate and extends in a predetermined extending direction on the upper surface of the semiconductor substrate; a mesa section in contact to the gate trench section in an arrangement direction orthogonal the extending direction; and an interlayer dielectric film provided above the semiconductor substrate; wherein the interlayer dielectric film is provided above at least a part of the gate trench section in the arrangement direction; a contact hole through which the mesa section is exposed is provided to the interlayer dielectric film; and a width of the contact hole in the arrangement direction is equal to or greater than a width of the mesa section in the arrangement direction.

20 Claims, 26 Drawing Sheets

(58) Field of Classification Search
CPC ............... H01L 29/4238; H01L 29/407; H01L 29/42376; H01L 29/0834; H01L 29/404; H01L 29/0696; H01L 29/66348; H01L 29/0653; H01L 27/0727
See application file for complete search history.

(56) References Cited

U.S. PATENT DOCUMENTS

| | | | |
|---|---|---|---|
| 2011/0316074 A1 | 12/2011 | Oota | |
| 2013/0221431 A1* | 8/2013 | Musha | ............... H01L 29/41766 257/330 |
| 2017/0077274 A1 | 3/2017 | Naito | |
| 2017/0213908 A1* | 7/2017 | Fursin | ................. H01L 29/0615 |
| 2018/0151558 A1* | 5/2018 | Cheng | ................. H01L 29/0834 |

FOREIGN PATENT DOCUMENTS

| | | | |
|---|---|---|---|
| JP | 2012009671 A | 1/2012 |
| JP | 2012199468 A | 10/2012 |
| JP | 2013008716 A | 1/2013 |
| JP | 2013182935 A | 9/2013 |
| JP | 2017010975 A | 1/2017 |
| JP | 2017059817 A | 3/2017 |
| JP | 2017162909 A | 9/2017 |

OTHER PUBLICATIONS

International Search Report and (ISA/237) Written Opinion of the International Search Authority for International Patent Application No. PCT/JP2018/045875, mailed by the Japan Patent Office dated Mar. 19, 2019.

* cited by examiner

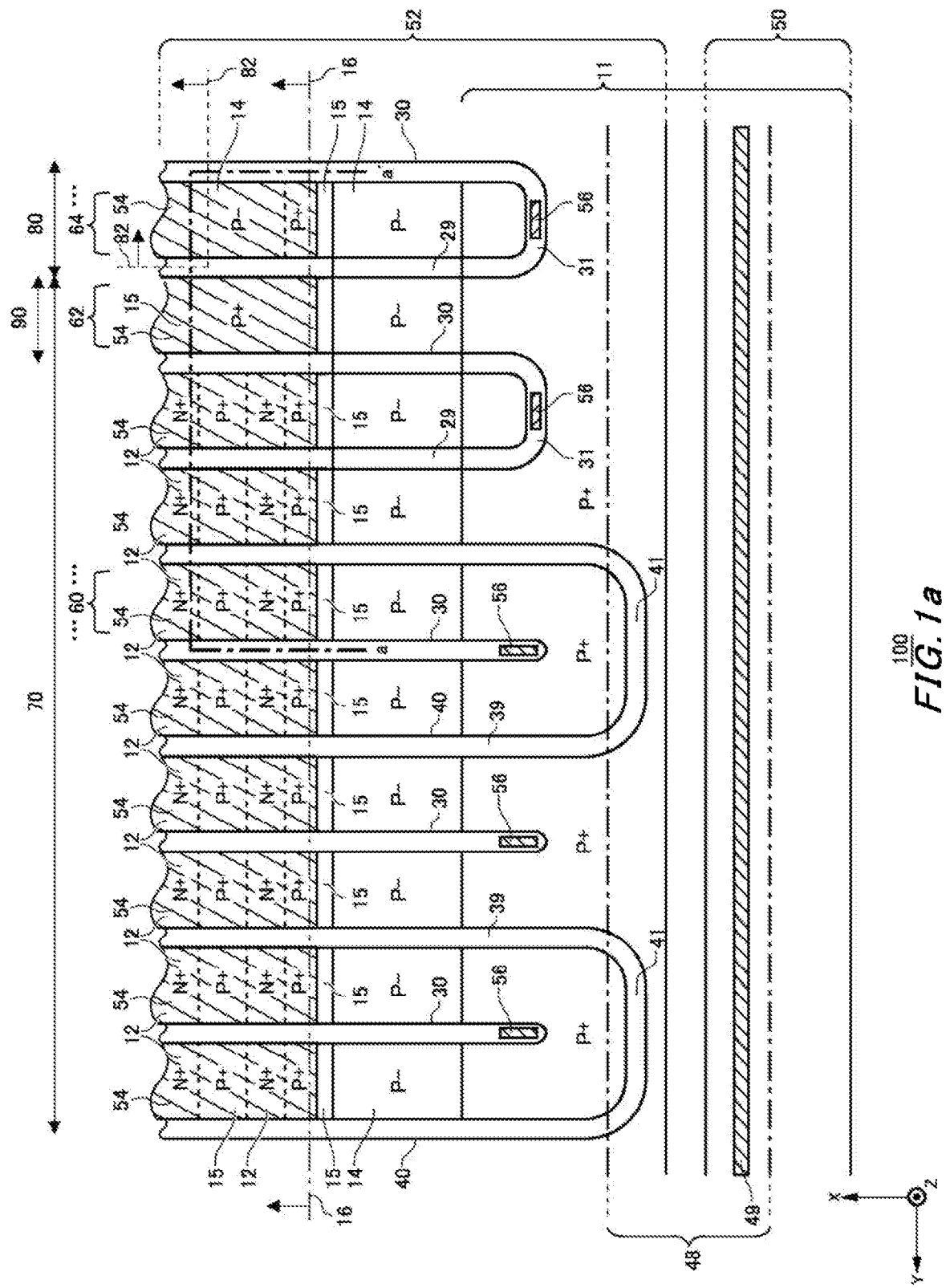

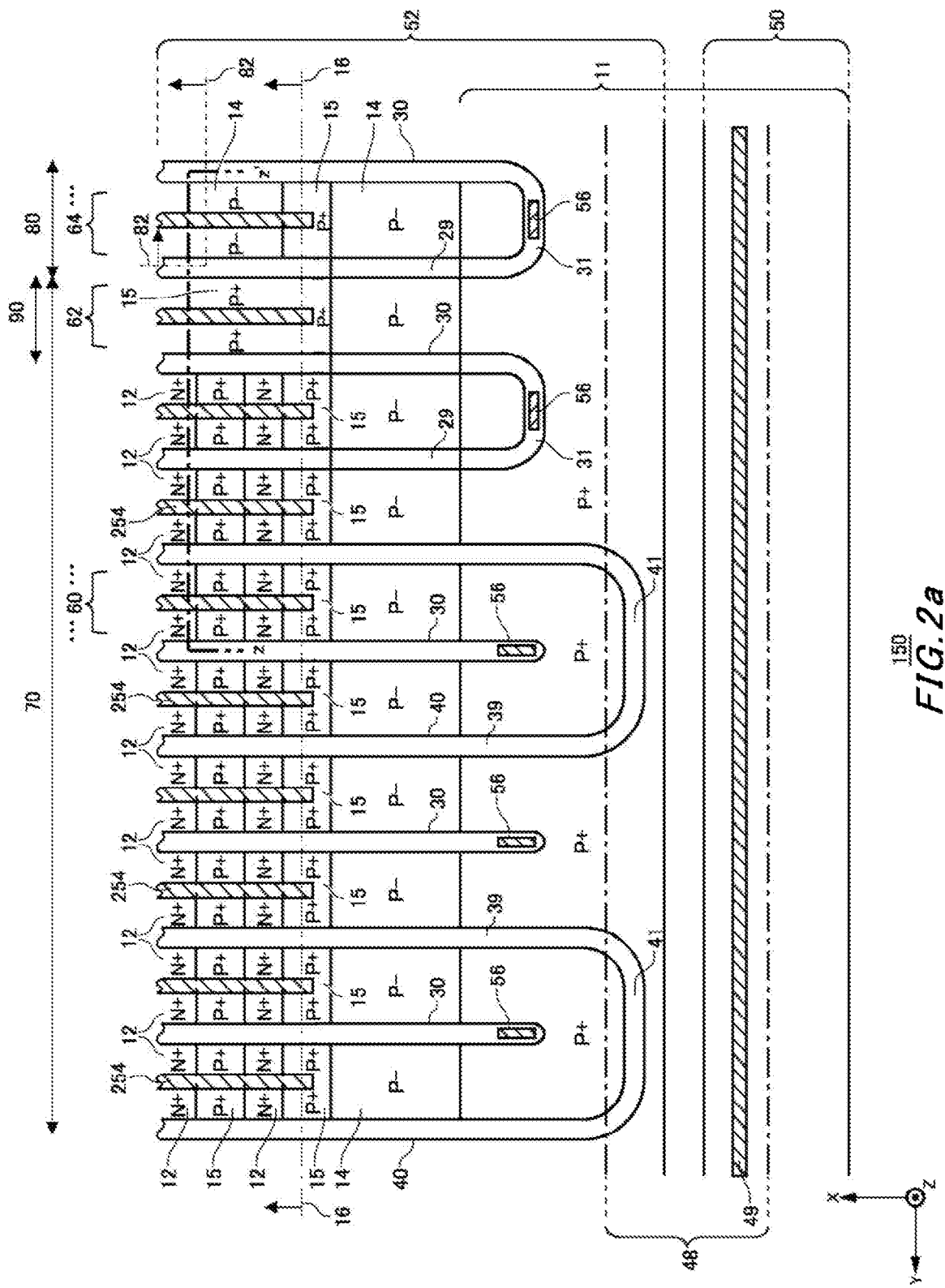

FIG. 15

SEMICONDUCTOR DEVICE

The contents of the following Japanese and PCT patent applications are incorporated herein by reference.
No. 2017-240064 filed in JP on Dec. 14, 2017 and PCT/JP2018/045875 filed on Dec. 13, 2018

BACKGROUND

1. Technical Field

The present invention relates to a semiconductor device.

2. Related Art

Conventionally, a semiconductor device such as an insulated gate bipolar transistor (IGBT) is known (refer to Patent Document 1, for example).
Patent Document 1: Japanese Patent Application Publication No. 2005-524975

It is preferable to reduce a mesa width of a semiconductor device.

In a first aspect of the present invention, a semiconductor device is provided. The semiconductor device may include a semiconductor substrate and a gate trench section that is provided from an upper surface to an inside of the semiconductor substrate and extends in a predetermined extending direction on the upper surface of the semiconductor substrate. The semiconductor device may include a mesa section in contact to the gate trench section in an arrangement direction orthogonal the extending direction. The semiconductor device may include an interlayer dielectric film provided above the semiconductor substrate. The interlayer dielectric film may be provided above at least a part of the gate trench section in the arrangement direction. A contact hole through which the mesa section is exposed may be provided to the interlayer dielectric film A width of the contact hole in the arrangement direction may be equal to or greater than a width of the mesa section in the arrangement direction.

The gate trench section may include a gate insulating film provided on an inner wall of the gate trench section. The gate trench section may include a gate conductive section surrounded by the gate insulating film inside the gate trench section. An upper end of the gate conductive section may be arranged below the upper surface of the semiconductor substrate. The interlayer dielectric film may be provided above at least a part of the gate conductive section in the arrangement direction.

The interlayer dielectric film may be provided from a first end to a second end of the gate trench section in the arrangement direction. A lower portion of the interlayer dielectric film may be thicker than an upper portion of the interlayer dielectric film, the lower portion being provided below the upper surface of the semiconductor substrate, and the upper portion being provided above the upper surface of the semiconductor substrate.

At above the upper surface of the semiconductor substrate, an angle formed between a side surface arranged at an end of the interlayer dielectric film in the arrangement direction and the upper surface of the semiconductor substrate may be 20 degrees or more and 60 degrees or less. A thickness of the interlayer dielectric film above the upper surface of the semiconductor substrate may be two times or more and four times or less of a thickness of the gate insulating film At above the upper surface of the semiconductor substrate, the interlayer dielectric film may include a convex part convex upward. A vertex of the convex part may be arranged above the gate insulating film in a direction orthogonal to the upper surface of the semiconductor substrate.

A vertex of the convex part may be arranged above the gate conductive section in a direction orthogonal to the upper surface of the semiconductor substrate. The interlayer dielectric film may include a depression on an upper surface of an upper portion provided above the upper surface of the semiconductor substrate and in a region not including a center of the interlayer dielectric film in the arrangement direction. The depression may be arranged above the gate conductive section in a direction orthogonal to the upper surface of the semiconductor substrate.

The interlayer dielectric film may include a contact hole through which the upper surface of the semiconductor substrate is exposed. The contact hole may be continuous above the mesa section and above the gate conductive section in the arrangement direction.

The semiconductor device may include a dummy trench section that is provided from the upper surface to the inside of the semiconductor substrate, extends in a predetermined extending direction on the upper surface of the semiconductor substrate, and faces the gate trench section in an arrangement direction orthogonal to the extending direction. The semiconductor device may include a contact extension section formed of a conductive material. The dummy trench section may include a dummy insulating film provided on an inner wall of the dummy trench section. The dummy trench section may include a dummy conductive section surrounded by the dummy insulating film inside the dummy trench section. An upper end of the dummy insulating film provided between a part of the inner wall of the dummy trench section facing the gate trench section and the dummy conductive section may be arranged below an upper end of the dummy conductive section. The contact extension section may be in contact to the upper end of the dummy insulating film The interlayer dielectric film may be provided below the upper surface of the semiconductor substrate inside the gate trench section.

A width of the interlayer dielectric film may increase in the arrangement direction as a distance between the interlayer dielectric film and the upper surface of the semiconductor substrate becomes short.

A width of the mesa section may decrease in the arrangement direction as a distance between the mesa section and the upper surface of the semiconductor substrate becomes short.

A trench contact made of a conductive material is provided on an upper surface the mesa section.

The summary clause does not necessarily describe all necessary features of the embodiments of the present invention. The present invention may also be a sub-combination of the features described above.

BRIEF DESCRIPTION OF THE DRAWINGS

FIG. 1a is a partial view of one example of an upper surface of a semiconductor device 100 according to the present embodiment. FIG. 1b illustrates one example of a cross section taken along a-a' in FIG. 1a.

FIG. 2a is a partial view of an upper surface of a semiconductor device 150 of a comparative example. FIG. 2b illustrates a cross section taken along z-z' in FIG. 2a.

FIG. 4a illustrates another example of a cross section taken along a-a' in FIG. 1a. FIG. 4b is an enlarged view of a region C1 in FIG. 4a.

FIG. 5a illustrates another example of a cross section taken along a-a' in FIG. 1a. FIG. 5b is an enlarged view of a region C2 in FIG. 5a.

FIG. 6a illustrates another example of a cross section taken along a-a' in FIG. 1a. FIG. 6b is an enlarged view of a region F in FIG. 6a.

FIG. 7 illustrates another example of a cross section taken along a-a' in FIG. 1a.

Figure 15:
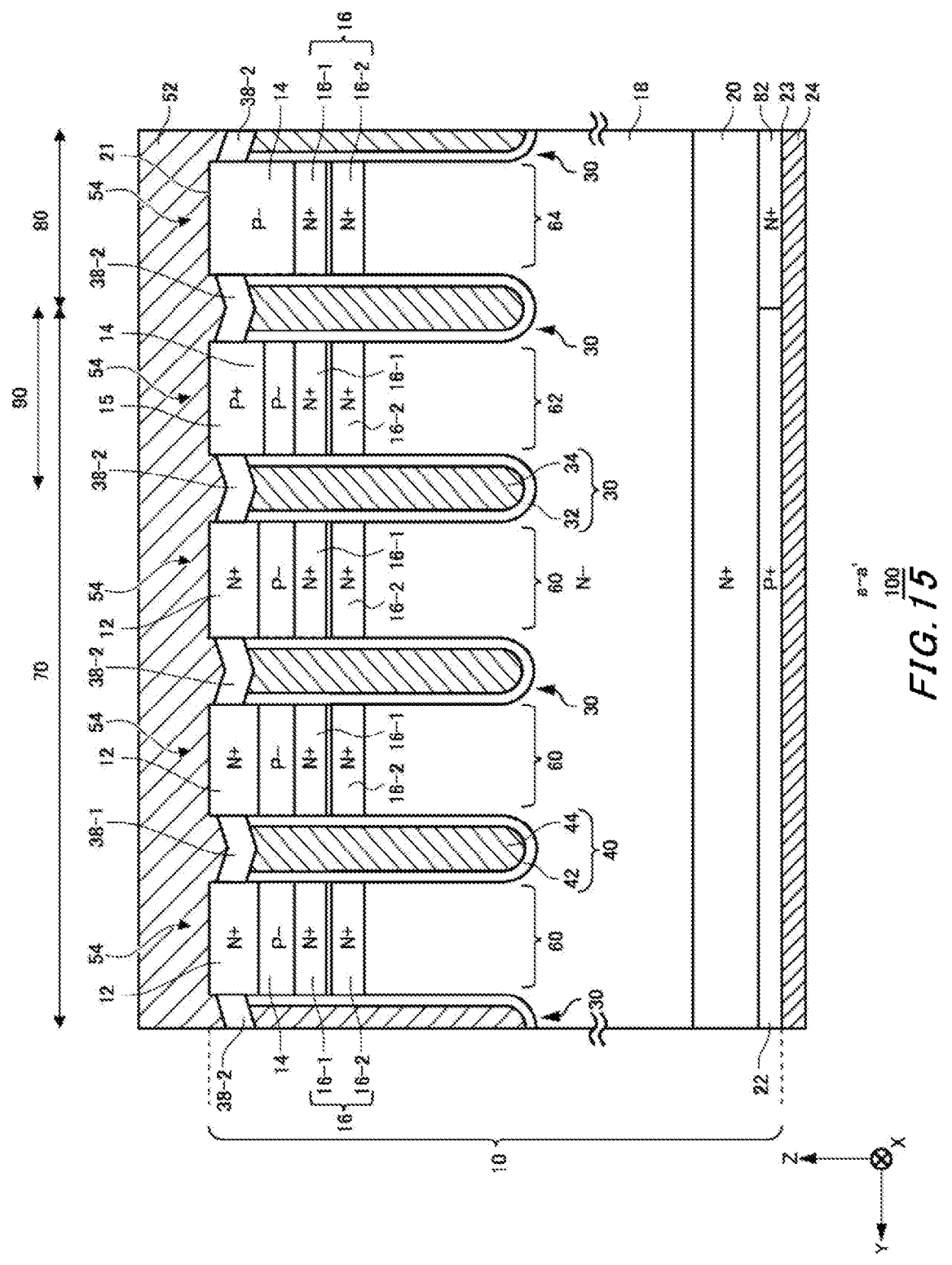

FIG. 15 illustrates one example of a cross section taken along a-a' in FIG. 14.

DESCRIPTION OF EXEMPLARY EMBODIMENTS

Figure 1B:
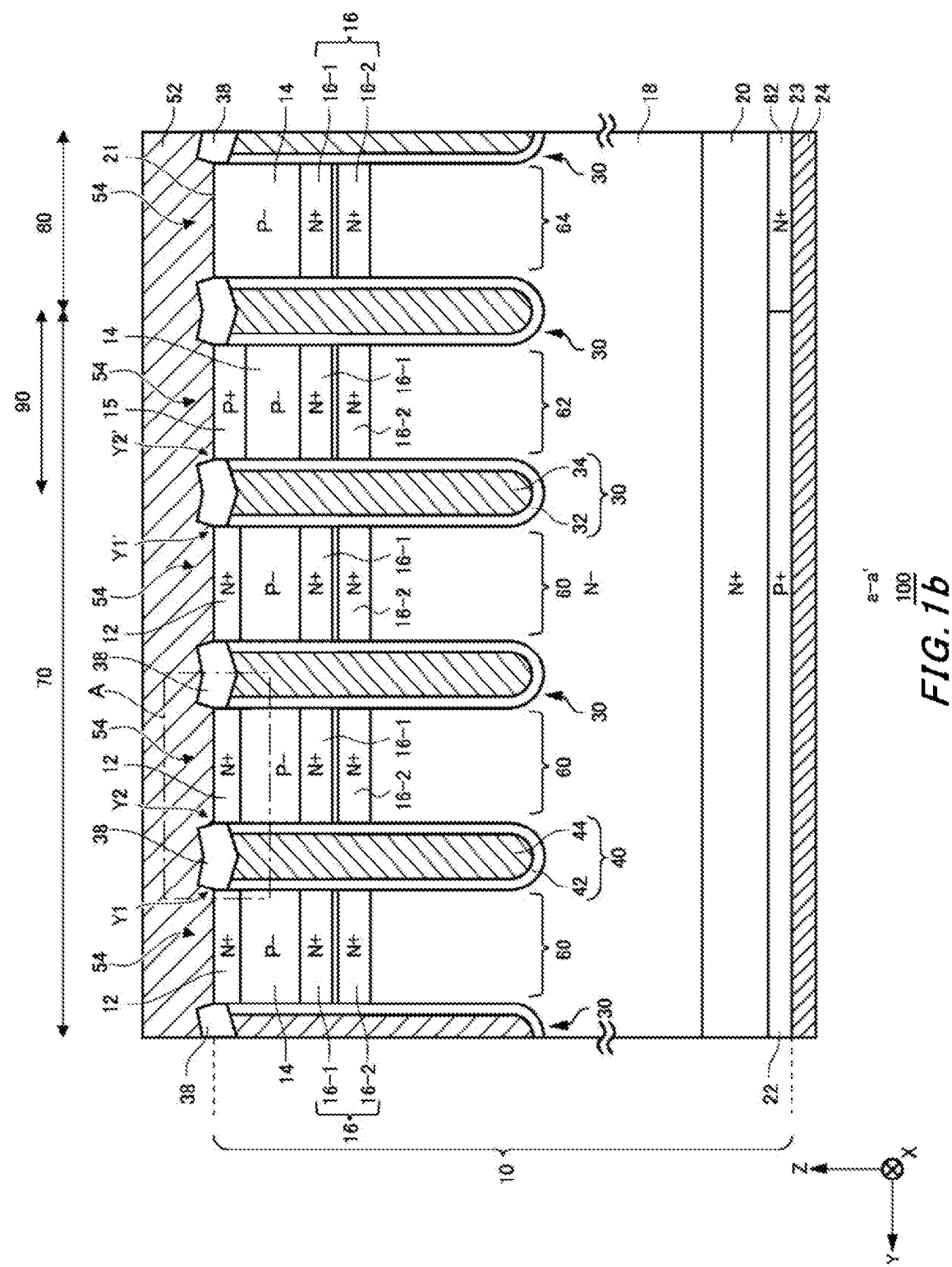

Hereinafter, the present invention is described through the embodiments of the invention. However, the following embodiments do not limit the invention according to the claims. Also, all the combinations of the features described in the embodiment(s) are not necessarily essential for means provided by aspects of the invention.

Herein, one side in a direction parallel to the depth direction of a semiconductor substrate is referred to as an "upper" side, and the other side is referred to as a "lower" side. One of two principal surfaces of a substrate, a layer or some other member is referred to as an upper surface, and the other surface is referred to as a lower surface. The "upper" and the "lower" directions are not limited by the direction of gravity or the direction of attachment to a substrate or the like at the time of implementation of a semiconductor device.

Herein, technical matters may be described using orthogonal coordinate axes of X axis, Y axis and Z axis. Herein, the X-Y plane is defined as a plane parallel to the upper surface of a semiconductor substrate, and Z-axis is defined to be along a depth direction perpendicular to the upper surface of the semiconductor substrate.

Although a first-conductivity-type is N-type and a second-conductivity-type is P-type in each example embodiment shown below, the first-conductivity-type may also be P-type, and the second-conductivity-type may also be N-type. In this case, conductivity-types of substrates, layers, regions and the like in each example embodiment have opposite polarities, respectively. Also, the reference to ((P+)-type) (or ((N+)-type)) herein means that it has higher doping concentration than P-type (or N-type), while the reference to ((P−)-type) (or ((N−−)-type)) means that it has lower doping concentration than P-type (or N-type).

Herein, doping concentration refers to the concentration of impurities acting as donors or acceptors. Herein, in some times, a difference of concentration between donors and acceptors is defined as a doping concentration. Also, a peak value of the doping concentration distribution of the doping region may be regarded as doping concentration in the doping region.

FIG. 1a is a partial view of one example of an upper surface of a semiconductor device 100 according to the present embodiment. In the present example, the semiconductor device 100 is a semiconductor chip including transistor sections 70 and diode sections 80 provided side by side with the transistor sections 70. The transistor sections 70 and the diode sections 80 may be alternately arranged in an arrangement direction parallel to an upper surface of the semiconductor chip. The transistor sections 70 include transistors such as IGBTs. A partial region of the transistor sections 70 in contact with the diode sections 80 is defined as a boundary portion 90. The diode sections 80 include diodes such as FWDs (Free Wheel Diodes). FIG. 1a illustrates a chip upper surface around a chip end portion and other regions are omitted.

Although FIG. 1a illustrates an active region of the semiconductor substrate in the semiconductor device 100, the semiconductor device 100 may have an edge termination structure section that surrounds the active region. The active region refers to a region where main current flows between an upper surface and a lower surface of the semiconductor substrate while the semiconductor device 100 is controlled to be turned on. The edge termination structure section relaxes electric field concentration on the upper surface side of the semiconductor substrate. The edge termination structure section has a structure of, for example, a guard ring, a field plate, a RESURF, or a combination thereof.

The semiconductor device 100 of the present example is provided inside the semiconductor substrate, and includes a gate trench section 40 that is exposed to the upper surface of the semiconductor substrate, a dummy trench section 30, a well region 11, an emitter region 12, a base region 14, and a contact region 15. Also, the semiconductor device 100 of the present example also includes an emitter electrode 52 and a gate metal layer 50 provided above the upper surface of the semiconductor substrate. The emitter electrode 52 and the gate metal layer 50 are provided separately from each other.

An interlayer dielectric film is provided between the emitter electrode 52 and the gate metal layer 50, and the upper surface of the semiconductor substrate, but the structure is omitted in FIG. 1a. In the present example, the interlayer dielectric film is provided with contact holes 56, contact holes 49 and contact holes 54 passing through the interlayer dielectric film. The upper surface of the semiconductor substrate is not covered by the interlayer dielectric film and is exposed through each contact hole. In FIG. 1a, each contact hole is indicated with hatch lines.

The gate metal layer 50 is in contact with a gate runner 48 through the contact hole 49. The gate runner 48 is formed of polysilicon doped with impurities, or the like. The gate runner 48 is connected to a gate conductive section in a gate trench section 40 on the upper surface of the semiconductor substrate. The gate runner 48 is not connected to a dummy conductive section in a dummy trench section 30.

In the present example, the gate runner 48 is provided from below the contact hole 49 to a tip portion of the gate trench section 40. An insulating film such as an oxide film is provided between the gate runner 48 and the upper surface of the semiconductor substrate.

At the tip portion of the gate trench section 40, a gate conductive portion is exposed at the upper surface of the semiconductor substrate. That is, at least a part of an upper end of the gate conductive section is not covered by materials constituting the semiconductor substrate. The upper end of the gate conductive section may be arranged below the upper surface of the semiconductor substrate. The gate trench section 40 is in contact to the gate runner 48 through an exposed portion of the gate conductive section.

The emitter electrode 52 and the gate metal layer 50 are formed of a material containing metal. At least partial region of the emitter electrode 52 may be formed of aluminum or aluminum-silicon alloy.

At least a partial region of the gate metal layer 50 may be formed of aluminum or aluminum-silicon alloy. The emitter electrode 52 and the gate metal layer 50 may include a barrier metal formed of titanium, titanium compound, and the like under the region formed of aluminum and the like. Additionally, the emitter electrode 52 and the gate metal layer 50 may include a plug formed of tungsten and the like in the contact hole.

One or more gate trench sections 40 and one or more dummy trench sections 30 are arrayed at predetermined intervals along a predetermined arrangement direction (Y-axis direction in the present example). The gate trench section 40 of the present example may include two extending portions 39 which extend in an extending direction parallel to the upper surface of the semiconductor substrate and perpendicular to the arrangement direction (the X-axis direction in the present example) and a connecting portion 41 for connecting the two extending portion 39. At least a part of the connecting portion 41 is preferably curved in a top view. By connecting ends of the two extending portions 39 of the gate trench sections 40, electric field concentration at ends of the extending portions 39 can be relaxed. Herein, each extending portion 39 of the gate trench section 40 may be regarded as one gate trench section 40. The gate runner 48 may be connected to the gate conductive section at the connecting portion 41 of the gate trench section 40.

The dummy trench section 30 in the present example may have a U-shape on the upper surface of the semiconductor substrate, like the gate trench section 40. That is, the dummy trench section 30 in the present example may have two extending portion 29 extending along the extending direction, and a connecting portion 31 for connecting the two extending portions 29.

The emitter electrode 52 is provided above the gate trench section 40, the dummy trench section 30, the well region 11, the emitter region 12, the base region 14 and the contact region 15. The well region 11 is of a second conductivity type. The well region 11 is of ((P+)-type), as an example. The well region 11 has higher doping concentration than the base region 14. The well region 11 is formed in a predetermined range from an end of the active region in a top view. The well region 11 may be provided deeper into the active region than the gate metal layer 50. A diffusion depth of the well region 11 may be greater than a depth of the gate trench section 40 and the dummy trench section 30. Ends of the gate trench section 40 and the dummy trench section 30 in the extending direction are provided in the well region 11. The well region 11 may cover bottoms of the ends of the gate trench sections 40 and the dummy trench sections 30 in a depth direction (Z-axis direction).

In a plane parallel to the upper surface of the semiconductor substrate, a mesa section is provided in contact with each trench section in the Y-axis direction. The mesa section may be a portion of the semiconductor substrate, where sandwiched by two adjacent trench sections, and may be a portion from the upper surface of the semiconductor substrate to the depth of the deepest bottom portion of each trench section. The mesa section may be defined as a region sandwiched by two adjacent extending portions (29 or 39).

In the transistor section 70, a first mesa section 60 is in contact with each trench section. On the boundary portion 90, a second mesa section 62 is provided in a region sandwiched by adjacent dummy trench sections 30. In the diode section 80, a third mesa section 64 is provided in a region sandwiched by adjacent dummy trench sections 30.

An emitter electrode 52 is provided above each mesa section. An interlayer dielectric film is arranged between each mesa section and the emitter electrode 52. An upper surface of each mesa section is exposed through contact holes 54 provided to the interlayer dielectric film Each mesa section and the emitter electrode 52 are electrically connected through the contact holes 54. The emitter electrode 52 may be provided in the contact hole 54. A conductive member made of different materials from the emitter electrode 52 may be provided in at least a part in the contact hole 54. Barrier metal in which at least one of a titanium film and a titanium nitride film are stacked may be arranged in the contact hole 54.

In the present example, a width of the contact hole 54 provided to each mesa section in the Y-axis direction is equal to or above a width of each mesa section in the Y-axis direction. That is, an entire region of each mesa section is exposed through the contact hole 54 in the Y-axis direction. However, a partial region of each mesa section in the X-axis direction may not be exposed. For example, in an example of FIG. 1a, an end of each mesa section in the X-axis direction is not exposed through the contact hole 54. Further, a width of a partial region of the contact hole 54 in the Y-axis direction may be smaller than a width of each mesa section in the Y-axis direction.

Such configuration makes it easy to maintain electrical connection between the emitter electrode 52 and each mesa section even if the semiconductor device 100 is miniaturized. For example, an increase in a contact resistance between the emitter electrode 52 and each mesa section can be suppressed.

As one example, second conductivity type base regions 14 are provided to both end portions of the first mesa section 60, the second mesa section 62, and the third mesa section 64 in the X-axis direction. The base region 14 is exposed at the upper surface of the semiconductor substrate. As one example, the base region 14 of the present example is of ((P−)-type). FIG. 1a only illustrates a first end of each mesa section in the X-axis direction.

On the upper surface of the first mesa section 60, the emitter region 12 is in contact with the gate trench section 40. The emitter region 12 may be provide from one trench section to the other trench section of two trench sections sandwiching the first mesa section 60 (in the present example, extending portion 29 or 39). The emitter region 12 is also provided below the contact hole 54. In FIG. 1a, an end portion with the emitter region 12 in a region overlapping the contact hole 54 is indicated by a dashed line in a top view of the semiconductor substrate.

The emitter region 12 may or may not be in contact with the dummy trench section 30. In the present example, the emitter region 12 is in contact with the dummy trench section 30. The emitter region 12 in the present example may be of the first conductivity type. The emitter region 12 of the present example is of ((N+)-type), as one example.

On the upper surface of the first mesa section 60, the second conductivity type contact region 15 having a higher doping concentration than the base region 14 is provided. The contact region 15 of the present example is, as one example, of the ((P+)-type). In the first mesa section 60, the emitter regions 12 and the contact regions 15 may be alternately provided in the extending direction of the gate trench section 40. The contact region 15 may be provided from one trench section to the other trench section of the two trench sections sandwiching the first mesa section 60. The contact region 15 is also provided below the contact hole 54. In FIG. 1a, a boundary with the contact region 15 in a region overlapping the contact hole 54 is indicated by a dashed line in top view of the semiconductor substrate.

The contact region 15 may or may not be in contact with the gate trench section 40. The contact region 15 may or may not be in contact with the dummy trench section 30. In the present example, the contact region 15 is in contact to the dummy trench section 30 and the gate trench section 40.

On the upper surface of the second mesa section 62, the contact region 15 is provided. An area of the contact region 15 provided on an upper surface of one second mesa section 62 is larger than an area of the contact region 15 provided on an upper surface of one first mesa section 60. An area of the contact region 15 provided on an upper surface of one second mesa section 62 may be larger than an area of the contact region 15 provided on an upper surface of one third mesa section 64. In the second mesa section 62, the contact region 15 is also provided below the contact hole 54.

The contact region 15 on an upper surface of the second mesa section 62 may be provided on an entire region sandwiched by two base regions 14. The two base regions 14 are provided on both end portions of the second mesa section 62 in the X-axis direction. In the second mesa section 62, carriers during the turn-off are extracted more easily as compared with the first mesa section 60.

On the upper surface of the third mesa section 64, the contact regions 15 are provided at both end portions in the X-axis direction. On the upper surface of the third mesa section 64, the base region 14 is provided in a region sandwiched by the contact regions 15 of both end portions. The base region 14 may be provided in an entire region sandwiched by the contact regions 15 in the X-axis direction. In the third mesa section 64, the base region 14 is also provided below the contact hole 54. The contact region 15 may also be provided below the contact hole 54.

In the third mesa section 64, the contact region 15 and the base region 14 are provided from one dummy trench section 30 to the other dummy trench section 30 of two dummy trench sections 30 sandwiching the third mesa section 64. That is, on the upper surface of the semiconductor substrate, a width of the third mesa section 64 in the Y-axis direction is equal to a width of the contact region 15 or the base region 14 provided in the third mesa section 64 in the Y-axis direction.

The third mesa section 64 may or may not be provided in the emitter region 12. In the present example, the emitter region 12 is not provided in the third mesa section 64.

In the semiconductor device 100 of the present example, the dummy trench section 30 is provided in the diode section 80. The dummy trench section 30 includes an extending portion 29. Two adjacent extending portions 29 may be connected through the connecting portion 31. The third mesa section 64 is a region sandwiched by respective dummy trench section 30 (the extending portions 29 in the present example).

The diode section 80 has the first conductivity type cathode region 82 on the lower surface of the semiconductor substrate side. The cathode region 82 of the present example is, as one example, the ((N+)-type). In FIG. 1a, a region where the cathode region 82 is provided in a top view of the semiconductor substrate is indicated by an alternate long and short dash line. The diode section 80 may be a region through which the cathode region 82 passes when the cathode region 82 is projected to the upper surface of the semiconductor substrate. In addition, the diode section 80 may include the entire third mesa section 64 in which the cathode region 82 is partially provided and the dummy trench section 30 in contact with the third mesa section 64. A region in which the cathode region 82 is projected on the upper surface of the semiconductor substrate may be away from the contact region 15 in the X-axis direction. In the third mesa section 64, a distance between the cathode region 82 and the well region 11 in the X-axis direction is larger than a distance between the contact region 15 and the well region 11 in the X-axis direction.

The second conductivity type collector region may be provided in a region of the lower surface of the semiconductor substrate where the cathode region 82 is not provided. The collector region of the present example is, as one example, ((P+)-type). The collector region may be provided at a position at which an end of the contact hole 54 in the diode section 80 in the X-axis direction is projected on the lower surface of the semiconductor substrate.

In the transistor section 70 except for the boundary portion 90, the contact hole 54 is provided above each of the contact region 15 and the emitter region 12. In a partial or entire first mesa section 60, the contact hole 54 may be provided so as not to overlap the gate trench section 40 (in the present example, extending portion 39) and the dummy trench section 30 (in the present example, extending portion 29) in a top view of FIG. 1a. A width of the contact hole 54 in the Y-axis direction may be equal to a width of the emitter region 12 and the contact region 15 in the Y-axis direction. A width of the contact hole 54 in each mesa section in the Y-axis direction may be equal to a width of each mesa section.

In a partial or entire first mesa section 60, the contact hole 54 may be provided so as to overlap the end of the gate trench section 40 (in the present example, extending portion 39) in the Y-axis direction in a top view of FIG. 1a. In each mesa section, the contact hole 54 may be provided so as to overlap the end of the dummy trench section 30 (in the present example, extending portion 29) in the Y-axis direction in a top view of FIG. 1a.

In the transistor section 70 except for the boundary portion 90, the contact holes 54 may be continuous from above the contact region 15 provided at the most negative side in the X-axis direction of the first mesa section 60 to above the contact region 15 provided at the most positive side in the X-axis direction in a top view of FIG. 1a. Herein, relative positions in each axis direction may be referred to as a positive side or a negative side. In each figure, a direction of an arrow in each axis is referred to as positive, while a reverse direction is referred to as negative. The contact hole 54 may be provided so as to overlap at least a part of the contact region 15 provide at the most negative side in the X-axis direction of the first mesa section 60 in a top view of FIG. 1a. The contact hole 54 may be provided so as to overlap at least a part of the contact region 15 provided at the most positive side in the X-axis direction of the first mesa section 60 in a top view.

In the boundary portion 90, the contact hole 54 is provided above the contact region 15. In the second mesa section 62, the contact hole 54 may be provided so as not to overlap the dummy trench section 30 (in the present example, extending portion 29) in a top view of FIG. 1a. A width of the contact hole 54 in the Y-axis direction may be equal to a width of the contact region 15 in the Y-axis direction. In the boundary portion 90, the contact hole 54 may be provided so as to overlap the end of the dummy trench section 30 (in the present example, extending portion 29) in the Y-axis direction in a top view of FIG. 1a.

In the boundary portion 90, the contact hole 54 may be provided above the contact region 15 of the second mesa section 62. The contact hole 54 may be provided so as to overlap at least a part of the contact region 15 of the second mesa section 62 in a top view of FIG. 1a.

In the diode section 80, the contact hole 54 is provided above the base region 14 and the contact region 15. In the third mesa section 64, the contact hole 54 may be provided so as not to overlap the dummy trench section 30 (in the present example, extending portion 29) in a top view of FIG. 1a. A width of the contact hole 54 in the Y-axis direction may be equal to a width of the base region 14 and the contact region 15 in the Y-axis direction. In the diode section 80, the contact hole 54 may be provided so as to overlap the end of the dummy trench section 30 in the Y-axis direction in a top view of FIG. 1a.

In the diode sections 80, the contact holes 54 may be continuous from above the contact region 15 provided at the most negative side in the X-axis direction of the third mesa section 64 to above the contact region 15 provided at the most positive side in the X-axis direction. The contact hole 54 may be provided so as to overlap at least a part of the contact region 15 provided at the end of the negative side in the X-axis direction of the third mesa section 64 in a top view of FIG. 1a. The contact hole 54 may be provided so as to overlap at least a part of the contact region 15 provided at the end of the positive side in the X-axis direction of the third mesa section 64 in a top view of FIG. 1a.

FIG. 1b illustrates one example of the cross section taken along a-a' in FIG. 1a. The a-a' cross section is a Y-Z plane passing through the emitter region 12 of the transistor sections 70, the contact region 15 of the boundary portion 90, and the base region 14 of the diode sections 80. In the a-a' cross-section, the semiconductor device 100 of the present example has a semiconductor substrate 10, an interlayer dielectric film 38, an emitter electrode 52, and a collector electrode 24. The interlayer dielectric film 38 covers the partial upper surface 21 of the semiconductor substrate 10. The emitter electrode 52 is provided on the upper surfaces of the semiconductor substrate 10 and the interlayer dielectric film 38.

The collector electrode 24 is provided on the lower surface 23 of the semiconductor substrate 10. The emitter electrode 52 and the collector electrode 24 are formed of a conductive material such as metal. Herein, the direction connecting the emitter electrode 52 and the collector electrode 24 is referred to as the depth direction (Z-axis direction).

The semiconductor substrate 10 may be a silicon substrate, a silicon carbide substrate, or a nitride semiconductor substrate such as gallium nitride. In the present example, the semiconductor substrate 10 is a silicon substrate.

The semiconductor substrate 10 includes a first conductivity type drift region 18. In the present example, the drift region 18 is of ((N−)-type). The drift region 18 may be a remaining region of the semiconductor substrate 10 in which other doping regions are not provided. A base region 14 is provided between the drift region 18 and the upper surface 21 of the semiconductor substrate 10.

One or more gate trench sections 40 and one or more dummy trench sections 30 are provided on the upper surface 21 of the semiconductor substrate 10. Each trench section extends from the upper surface 21 to pass through the base region 14 and reach the drift region 18.

The gate trench section 40 includes a gate trench provided in the upper surface 21, and the gate insulating film 42 and the gate conductive section 44 provided in the gate trench. An upper end of a gate trench may be at the same position as the upper surface 21 in the Z-axis direction. The gate insulating film 42 covers an inner wall of a gate trench. The gate insulating film 42 may be formed by oxidizing or nitriding semiconductors on an inner wall of a gate trench. The gate conductive section 44 is provided inside a gate trench and at an inner side relative to the gate insulating film 42. That is, the gate insulating film 42 insulates the gate conductive section 44 and the semiconductor substrate 10 from each other. The gate conductive section 44 is formed of a conductive material such as polysilicon.

The gate conductive section 44 includes a region facing the base region 14 across the gate insulating film 42 in a depth direction. In the cross section, the gate trench section 40 is covered by the interlayer dielectric film 38 on the upper surface 21. When a predetermined voltage is applied to the gate conductive section 44, a channel as an inversion layer of electrons is formed in the interfacial surface layer of the base region 14 in contact with the gate trench.

The dummy trench section 30 may have the same structure as the gate trench section 40 in the cross section. The dummy trench section 30 includes a dummy trench provided at the upper surface 21 side and the dummy insulating film 32 and the dummy conductive section 34 provided in a dummy trench. The upper end of the dummy trench may be at the same position as the upper surface 21 in the Z-axis direction. The dummy insulating film 32 covers an inner wall of a dummy trench. The dummy conductive section 34 is provided inside a dummy trench and provided at an inner side relative to the dummy insulating film 32. The dummy insulating film 32 insulates the dummy conductive section 34 and the semiconductor substrate 10 from each other.

The dummy conductive section 34 may be formed of the same material as the gate conductive section 44. For example, the dummy conductive section 34 is formed of a conductive material such as polysilicon. The dummy conductive section 34 may have the same length as the gate conductive section 44 in the depth direction. Note that, bottom portions of the dummy trench section 30 and the gate trench section 40 may have a shape of a downwardly-convex curved surface (curved shape in the cross section).

A region sandwiched between trench sections is a mesa section. The emitter region 12 that is in contact to the upper surface 21 and the gate trench section 40 is provided in the first mesa section 60. That is, the emitter region 12 is provided above the base region 14. The emitter region 12 has a higher doping concentration than the drift region 18. As illustrated in FIG. 1a, the first mesa section 60 is provided with the emitter regions 12 and the contact regions 15 alternately in the X-axis direction. In a YZ cross section passing through the contact region 15 of the first mesa section 60, the contact region 15 is provided instead of the emitter region 12 of FIG. 1b. The contact region 15 is provided in contact with the upper surface 21 and in contact with the gate trench section 40.

In the second mesa section 62, the contact region 15 is provided by contacting to the upper surface 21. That is, the contact region 15 is provided above the base region 14. The contact region 15 may be in contact to or away from the dummy trench section 30. FIG. 1b illustrates an example where the contact region 15 is in contact to the dummy trench section 30.

The third mesa section 64 is provided with the base region 14 in contact to the upper surface 21. In each mesa section, the base region 14 is in contact to each trench section.

The interlayer dielectric film 38 is provided above at least a part of the gate trench section 40. In the a-a' cross section, the interlayer dielectric film 38 is provided between a first end Y1 and a second end Y2 of the gate trench section 40. The first end Y1 is an end of a positive side in the Y-axis direction of the gate trench section 40 on the upper surface 21. The second end Y2 is an end of a negative side in the Y-axis direction of the gate trench section 40 on the upper surface 21. In the present example, the interlayer dielectric film 38 is continuous in the Y-axis direction from the first end Y1 to the second end Y2 of the gate trench section 40. That is, the interlayer dielectric film 38 covers the entire gate trench section 40 in the Y-axis direction.

As similar to the gate trench section 40, the interlayer dielectric film 38 may be provided above at least a part of the dummy trench section 30. In the a-a' cross section, the interlayer dielectric film 38 is provided between a first end Y1' and a second end Y2' of a dummy trench section 30. The first end Y1' is an end of a positive side in the Y-axis direction of the dummy trench section 30 on the upper surface 21. The second end Y2' is an end of a negative side in the Y-axis direction of the dummy trench section 30 on the upper surface 21. In the present example, the interlayer dielectric film 38 is continuous in the Y-axis direction from the first end Y1' to the second end Y2' of the dummy trench section 30. That is, the interlayer dielectric film 38 covers the entire dummy trench section 30 in the Y-axis direction.

In the a-a' cross section, the interlayer dielectric film 38 is not provided on each mesa section. That is, the interlayer dielectric film 38 overlaps none of the first mesa section 60, the second mesa section 62, and the third mesa section 64 in the Z-axis direction. A contact hole 54 is provided between two interlayer dielectric films 38 arranged above two adjacent trench sections respectively in the Y-axis direction. As described above, each entire mesa section in the Y-axis direction is exposed through the contact hole 54. This can reduce a contact resistance between each mesa section and the emitter electrode 52.

At least a part of the interlayer dielectric film 38 may be provided inside each trench. In this case, upper ends of a conductive section and an insulating film inside each trench are arranged below the upper surface 21. The interlayer dielectric film 38 may be in contact to the conductive section and the insulating film inside each trench. Provision of interlayer dielectric film 38 inside each trench can suppress extension of the interlayer dielectric film 38 over a mesa section. The interlayer dielectric film 38 can be easily formed to be thick, and thus, the insulation between an emitter electrode 52 and a conductive section inside each trench can be enhanced. At least a part of the interlayer dielectric film 38 may be arranged above the upper surface 21. The interlayer dielectric film 38 may be a silicate glass such as PSG and BPSG. The interlayer dielectric film 38 may also be an oxide film, a nitride film, or the like.

In the first mesa section 60, one or more accumulation regions 16 contacting to a gate trench section 40 are provided between the drift region 18 and the base region 14. If a plurality of accumulation regions 16 are provided, the individual accumulation regions 16 are arranged in an array along the Z-axis direction. The accumulation region 16 is a first conductivity type region, and as one example, is of ((N+)-type). The accumulation region 16 has a higher doping concentration than the drift region 18. Provision of the accumulation region 16 can enhance a carrier injection enhancement effect (IE effect) and reduce an on-state voltage drop.

In the first mesa section 60, one or more accumulation regions 16 may be in contact to or away from the dummy trench section 30. FIG. 1b illustrates an example where the accumulation regions 16 are in contact to the dummy trench sections 30. It is noted that the second mesa section 62 and the third mesa section 64 may or may not be provided with the accumulation region 16. FIG. 1b illustrates an example where the accumulation region 16 is provided in the second mesa section 62 and the third mesa section 64.

In the first mesa section 60, the second mesa section 62, and the third mesa section 64, a plurality of accumulation regions 16 may be provided in the Z-axis direction. FIG. 1b illustrates one example where two accumulation regions 16-1 and 16-2 are provided in the Z-axis direction. In the Z-axis direction, a drift region 18 may be provided between the accumulation region 16-1 and the accumulation region 16-2. By providing a plurality of accumulation regions 16, electronic current can easily flow through around the center of the first mesa section 60. Therefore, hole distribution in the vicinity of a bottom portion of the first mesa section 60 can be divided around the center of the first mesa section 60. This can suppress accumulation of holes at a lower end of the gate trench section 40. As a result, the displacement current of the transistor sections 70 can be reduced.

A first-conductivity-type buffer region 20 may be provided below the drift region 18. The buffer region 20 is of ((N+)-type), as one example. The buffer region 20 has a higher doping concentration than the drift region 18. The buffer region 20 may function as a field stop layer that prevents a depletion layer spread from an upper end of the drift region 18 from reaching a ((P+)-type) collector region 22 and an ((N+)-type) cathode region 82.

In the transistor section 70, a ((P+)-type) collector region 22 is provided below the buffer region 20 and exposed on the lower surface 23. In the diode section 80, a ((N+)-type) cathode region 82 is provided below the buffer region 20 and exposed on the lower surface 23. In the boundary portion 90, either the collector region 22 or the cathode region 82 is provided below the buffer region 20. In the present example, in the boundary portion 90, the collector region 22 is provided below the buffer region 20.

The diode section 80 is a region overlapping the cathode region 82 except for the boundary portion 90 in a direction perpendicular to the lower surface 23. The transistor section 70 is a region in which predetermined unit structures including the emitter region 12 and the contact region 15 are regularly arranged among the region overlapping the collector region 22 except for the boundary portion 90 in a direction perpendicular to the lower surface 23. The boundary portion 90 is a region in which a total area of the contact region 15 provided to one second mesa section 62 in a top view is larger than a total area of the contact region 15 provided to one first mesa section 60 in a top view.

Figure 1C:
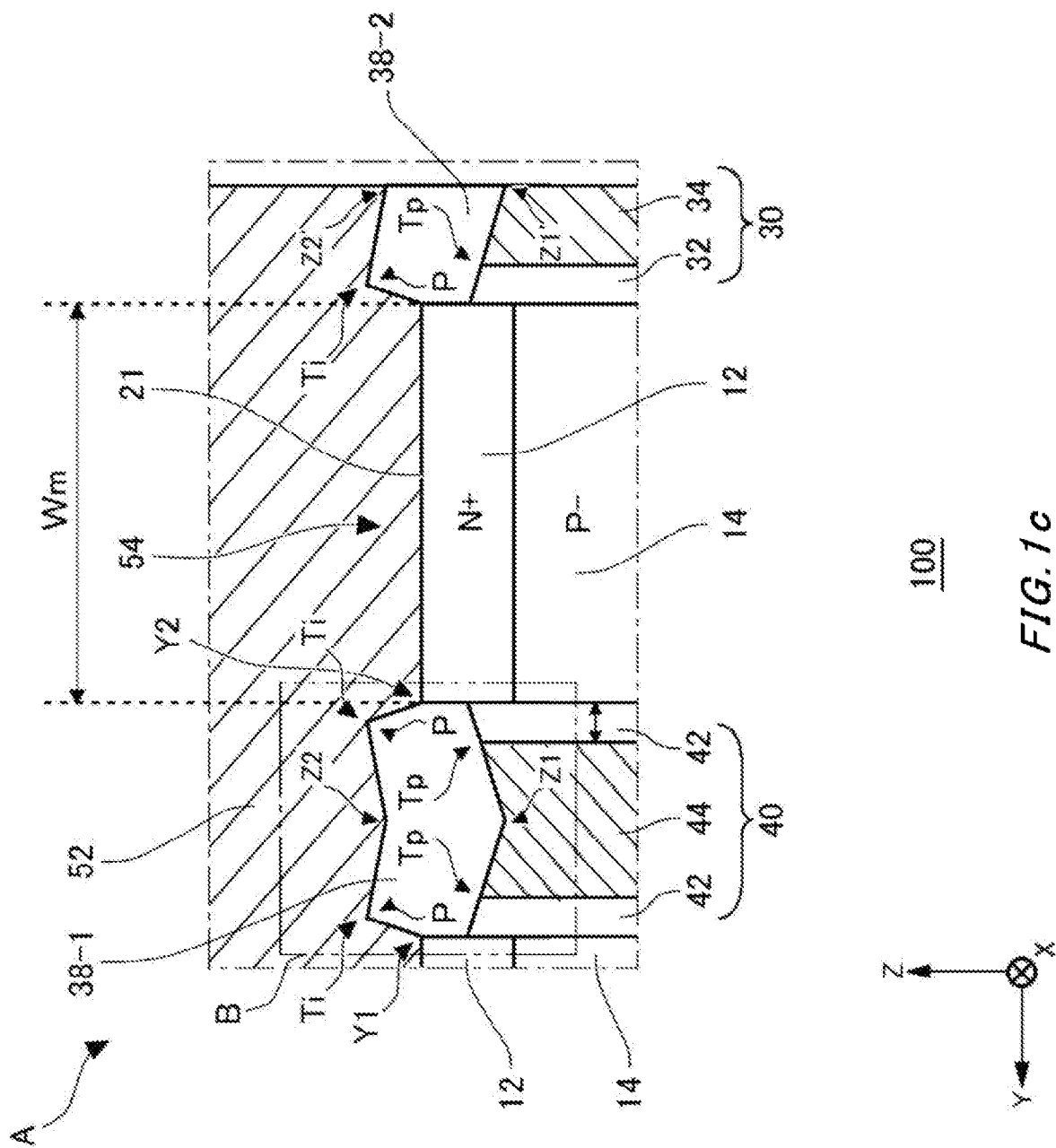
FIG. 1c is an enlarged view of a region A in FIG. 1b.

FIG. 1c illustrates a region A from FIG. 1b at an enlarged scale. In the present example, the interlayer dielectric film 38-1 is provided to the gate trench section 40 and the interlayer dielectric film 38-2 is provided to the dummy trench section 30. In FIG. 1c, the gate conductive section 44 has upper ends Tp at both ends in the Y-axis direction. Positions of the two upper ends Tp in the Z-axis direction may be the same. The upper ends Tp may be arranged below the upper surface 21.

The interlayer dielectric film 38-1 is provided above at least a part of the gate conductive section 44. In FIG. 1c, the interlayer dielectric film 38-1 covers at least a part of the gate conductive section 44 from a position of a first upper end Tp to a position of a second upper end Tp.

The interlayer dielectric film 38-1 may cover the entire gate conductive section 44. That is, the interlayer dielectric film 38-1 may be continuous between two upper ends Tp of the gate conductive section 44. FIG. 1c illustrates an example in which the interlayer dielectric film 38-1 covers the entire gate conductive section 44.

The upper surface of the gate conductive section 44 has a lower end Z1 at the center in the Y-axis direction. The lower end Z1 is a lowest region of the upper surface of the gate conductive section 44. That is, the center of the upper surface of the gate conductive section 44 may be recessed. In a case where the gate conductive section 44 is removed from the upper surface 21 by etching, a central part is likely to be arranged below a peripheral part due to a difference in an etching rate between the central part and the peripheral part of the gate conductive section 44.

The interlayer dielectric film 38-1 may have at least one convex P on the upper surface. The convex P is arranged above the upper surface 21 and has shapes convex upward. In the present example, the interlayer dielectric film 38-1 has two convexes P. Positions of two convexes P in the Z-axis direction may be the same. Provision of depression on the upper surface of the gate conductive section 44 can make easy formation of convexes P to the interlayer dielectric film 38-1.

Two convexes P may be arranged across the lower end Z1 of the upper surface of the gate conductive section 44 in the Y-axis direction. The vertices Ti of the convexes P may be arranged inside the first end Y1 and the second end Y2 of the gate trench section 40 in the Y-axis direction. Inside is defined as a side close to the center of the gate trench section 40 in the Y-axis direction. Each vertex Ti may be arranged above the gate insulating film 42.

The upper surface of the interlayer dielectric film 38-1 has a lower end Z2 at the central part in the Y-axis direction. The lower end Z2 is a lowest region on the upper surface of the interlayer dielectric film 38-1. The lower end Z2 on the upper surface of the interlayer dielectric film 38-1 may have the same position with the lower end Z1 on the upper surface of the gate conductive section 44 in the Y-axis direction. The interlayer dielectric film 38-1 is provided above the gate conductive section 44 having the lower end Z1, and thus, the central part of the interlayer dielectric film 38-1 is likely to have a shape having the lower end Z2.

The dummy trench section 30 may have the same structure as the gate trench section 40. The interlayer dielectric film 38-1 and the interlayer dielectric film 38-2 may have the same structure. For example, the upper end Tp of the dummy conductive section 34 may be arranged below the upper surface 21 as similar to the upper end Tp of the gate conductive section 44. The interlayer dielectric film 38-2 may be provided above at least a part of the dummy conductive section 34 in the Y-axis direction. The interlayer dielectric film 38-2 may be provided above the entire dummy conductive section 34 in the Y-axis direction.

The upper surface of the dummy conductive section 34 has a lower end Z1' at a central part in the Y-axis direction. The lower end Z1' is a lowest region of the upper surface of the dummy conductive section 34.

The interlayer dielectric film 38-2 may have at least one convex P on the upper surface. The convex P is arranged above the upper surface 21 and has a shape convex upward. In the present example, the interlayer dielectric film 38-2 has two convexes P. FIG. 1c illustrates one convex P of the interlayer dielectric film 38-2. In the dummy trench section 30 and the gate trench section 40, positions of convexes P in the Z-axis direction may be the same.

In the present example, the vertex Ti of the convex P of the interlayer dielectric film 38-2 may be provided above the dummy insulating film 32 arranged at an end of the dummy trench section 30 in the Y-axis direction. The upper surface of the interlayer dielectric film 38-2 has a lower end Z2' at the center in the Y-axis direction. The lower end Z2' is a lowest region on the upper surface of the interlayer dielectric film 38-2.

A width Wm is a mesa width of each mesa section. Mesa widths of individual mesa sections may be the same. FIG. 1c illustrates a mesa width Wm of a first mesa section 60. The width Wm is a distance between the gate trench section 40 and the dummy trench section 30 on the upper surface 21 in the Y-axis direction in FIG. 1c. The interlayer dielectric film 38-1 is away from the interlayer dielectric film 38-2 by the width Wm in the Y-axis direction on the upper surface 21. A distance between the interlayer dielectric film 38-1 and the interlayer dielectric film 38-2 on the upper surface 21 in the Y-axis direction may be minimal.

In the semiconductor device 100 of the present example, the gate conductive section 44 is arranged below the upper surface 21 and the interlayer dielectric film 38-1 is provided above the gate conductive section 44. Therefore, even if a width of the contact hole 54 on the upper surface 21 in the Y-axis direction is made equal to the width Wm, the contact (for example, emitter electrode 52) provided to the contact hole 54 is less likely to contact to the gate conductive section 44. Therefore, the gate metal layer 50 and the emitter electrode 52 are unlikely to short (GE short). That is, the occurrence of the GE short can be suppressed while reducing a contact resistance between the emitter electrode 52 and the first mesa section 60. This can easily make narrow the width Wm of the first mesa section 60. Similarly, the second mesa section 62 and the third mesa section 64 can also be easily narrowed.

FIG. 2a is a partial view of an upper surface of a semiconductor device 150 of a comparative example. In the semiconductor device 150 of the comparative example, contact holes 254 are provided in partial regions of the first mesa section 60, the second mesa section 62, and the third mesa section 64 individually in the Y-axis direction. That is, a width of the contact hole 254 in the Y-axis direction is smaller than mesa widths of the first mesa section 60, the second mesa section 62, and the third mesa section 64 individually in a top view of FIG. 2a.

Figure 2B:
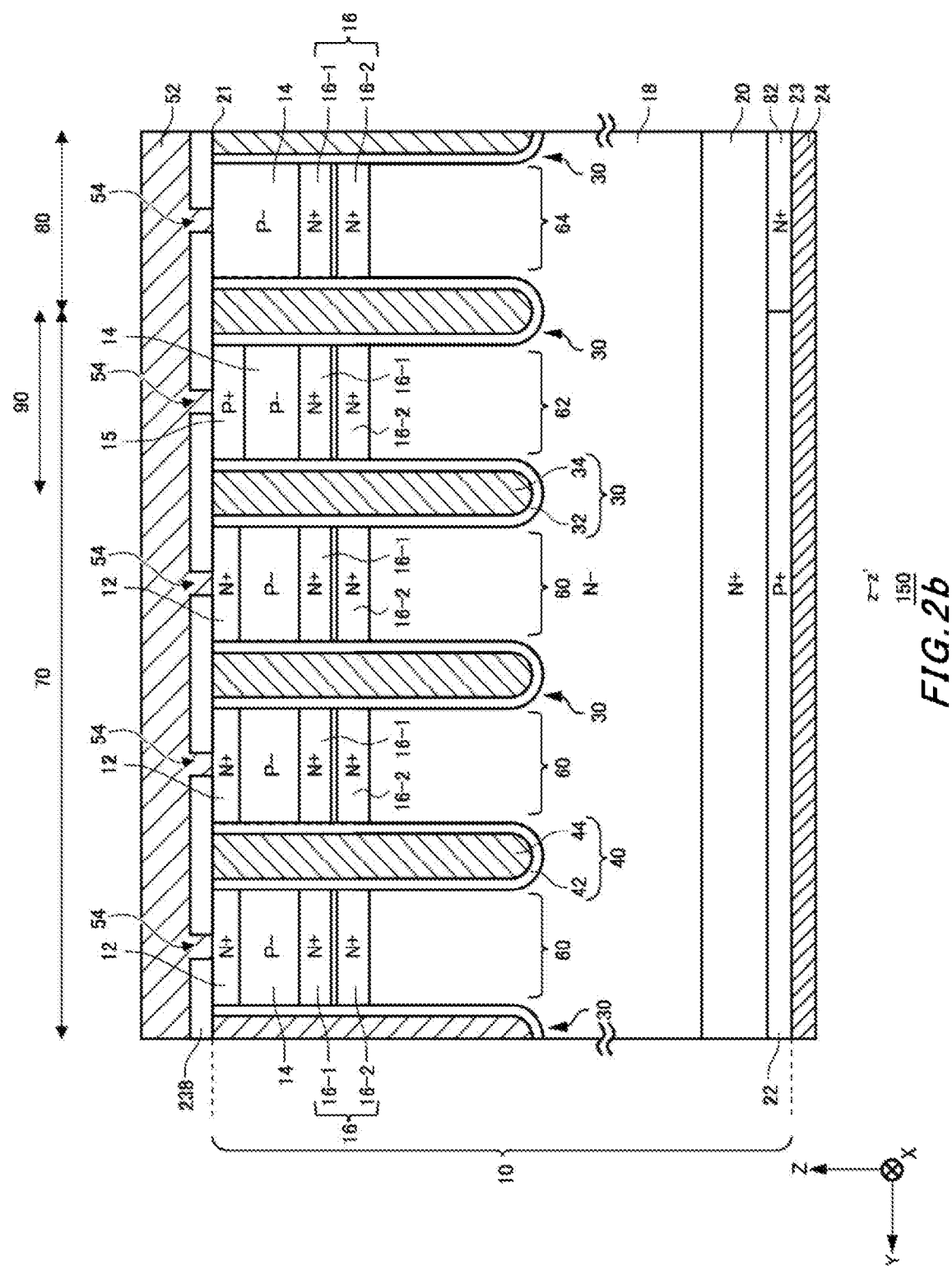

FIG. 2b illustrates the cross section taken along z-z' in FIG. 2a. In the semiconductor device 150 of the comparative example, an interlayer dielectric film 238 covering each trench section also covers a mesa section in contact to each trench section. Therefore, if a width of a mesa section is reduced, a contact resistance between an emitter electrode 52 and each mesa section increases.

In the semiconductor device 150 of the comparative example, an upper surface of the gate conductive section 44 and the upper surface 21 have the same position in the Z-axis direction. This makes difficult to enhance the insulation between the gate conductive section 44 and the emitter electrode 52.

Figure 3:
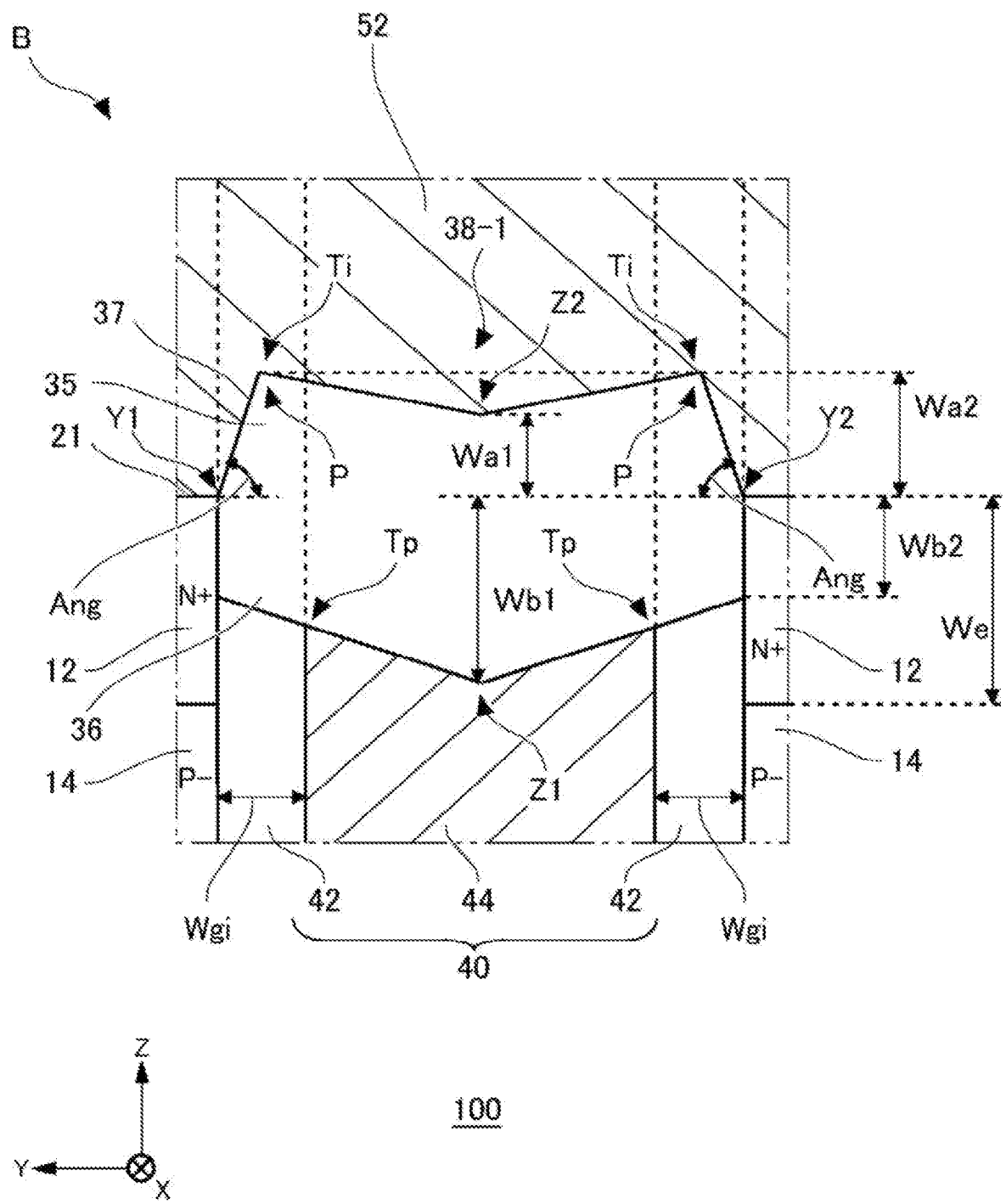
FIG. 3 is an enlarged view of a region B in FIG. 1c.

FIG. 3 is an enlarged view of a region B in FIG. 1c. As illustrated in FIG. 3, thicknesses Wa1 and Wa2 are thicknesses of interlayer dielectric film 38-1 provided above the upper surface 21. The thickness Wa1 may be a thickness at a position of a lower end Z2 and the thickness Wa2 may be a thickness at a position of a vertex Ti. Thicknesses Wb1 and Wb2 are thicknesses of the interlayer dielectric film 38-1 provided below the upper surface 21. The thickness Wb1 may be a thickness at a position of a lower end Z1 and a thickness Wb2 may be a thickness at a position of a side wall of the gate trench section 40 (that is, first end Y1 or second end Y2). In the present example, the thickness Wb2 is a minimum value of a thickness of the interlayer dielectric film 38. Further, the thickness We is a depth in the Z-axis direction from the upper surface 21 to a lower end of the emitter region 12. The thickness We may be a depth of the emitter region 12 of a portion in contact to the side wall of the gate trench section 40.

A lower portion 36 of the interlayer dielectric film 38 provided below the upper surface 21 may be thicker than an upper portion 35 of the interlayer dielectric film 38 provided above the upper surface 21. At the center of the gate trench section 40 in the Y-axis direction, thicknesses of respective portions of the interlayer dielectric film 38 may be compared. That is, at the center of the gate trench section 40 in the Y-axis direction, a thickness Wb1 of the lower portion 36 of the interlayer dielectric film 38-1 may be larger than a thickness Wa1 of the upper portion 35. A thickness of the interlayer dielectric film 38-1 above the upper surface 21 may be locally larger than a thickness of the interlayer dielectric film 38-1 below the upper surface 21. At an end in the Y-axis direction, the thickness Wa2 of the upper portion of the interlayer dielectric film 38-1 may be larger than the thickness Wb2 of the lower portion. In the interlayer dielectric film 38-1, an average value of thicknesses of the upper portion above the upper surface 21 may be smaller than an average value of thicknesses of the lower portion below the upper surface 21.

By increasing a thickness of the lower portion of the interlayer dielectric film 38 below the upper surface 21, the contact between the contact provided to the contact hole 54 and the gate conductive section 44 can be more reliably suppressed. This can suppress the occurrence of the GE short more reliably.

An angle Ang is an angle formed between a side surface 37 of an interlayer dielectric film 38 and the upper surface 21. The side surface 37 is a side surface above the upper surface 21. The side surface 37 is arranged at an end of the interlayer dielectric film 38 in the Y-axis direction. In the present example, the side surface 37 in a YZ plane is indicated by a straight line connecting a vertex Ti to a first end Y1. In the present example, the angle Ang is an angle of the interlayer dielectric film 38 side among angles formed between the side surface 37 and the upper surface 21. The side surface 37 may be indicated by a straight line connecting a vertex Ti to a second end Y2.

As the angle Ang is small, contacts are easily filled to a lower end of a contact hole 54. On the other hand, it becomes difficult to suppress the contact between the contact provided to the contact hole 54 and the gate conductive section 44. As the angle Ang is large, more reliably the contact between the contact provided to the contact hole 54 and the gate conductive section 44 can be suppressed. On the other hand, contacts are less likely to be filled to a lower end of the contact hole 54. Therefore, considering a balance between the filling property of contacts and the insulation between the contact and the gate conductive section 44, the angle Ang is preferably 20 degrees or more and 60 degrees or less, and more preferably 30 degrees or more and 50 degrees or less.

When the contacts are filled up to a lower part of the contact hole 54, the contacts contact to the entire upper surfaces of the emitter region 12 and the contact region 15 in the Y-axis direction in the first mesa section 60. Therefore, even if the mesa width Wm is reduced, an electrical connection between the emitter region 12 and the contact region 15, and the contacts can be secured.

A width Wgi is a width of the gate insulating film 42 in the Y-axis direction, and as the width Wb1 and the width Wb2 are large, the contacts provided to the contact hole 54 and the gate conductive section 44 are less likely to contact with each other, and it is possible to improve the insulation between the contacts and the gate conductive section 44. However, as the width Wb1 and the width Wb2 increase, the upper surface of the gate conductive section 44 is arranged below, and thus, it becomes necessary to implant dopants to a deep position to form an emitter region 12. When dopants are implanted from the upper surface 21 to a deep position, the thermal history increases in a heat treatment step of forming the emitter region 12. Therefore, considering a balance between the insulation between the contact and the gate conductive section 44 and a depth from the upper surface 21 of the emitter region 12, the width Wb1 is preferably two times or more and four times or less of the width Wgi and the width Wb2 is more preferably 1.5 times or more and 3.5 times or less of the width Wgi.

The width We of the emitter region 12 in a depth direction may be 1.5 times or more and 3.5 times or less of the width Wb2. The width We may be 0.35 µm or more and 0.45 µm or less. As one example, the width We is 0.4 µm. The width Wb2 may be 0.1 µm or more and 0.3 µm or less. As one example, the width Wb2 is 0.2 µm. The width Wb1 may be 0.7 times or more and 0.9 times or less of the width We. The width Wb1 may be 0.2 µm or more and 0.4 µm or less. As one example, the width Wb1 is 0.3 µm. The width We is preferably 1.5 times or more and 3.5 times or less of the width Wb2 from the viewpoint of the thermal history in the heat treatment step of forming the emitter region 12 as described above. The width Wb1 is preferably 0.7 times or more and 0.9 times or less of the width We.

The mesa width Wm may be wider than the width Wa1 and may be wider than the width Wa2. The mesa width Wm may be wider than the width Wb2 and may be wider than the width Wb1. By increasing the mesa width Wm than the width Wa1 and the width Wa2, the contacts are easily filled up to a lower end of the contact hole 54. This can secure a contact area between the emitter region 12 and the contact region 15, and the contacts. This can secure an electrical connection between the emitter region 12 and the contact region 15, and the contacts.

A vertex Ti of the convex P may be above the gate insulating film 42 provided at an end of the gate trench section 40 in the Y-axis direction. By arranging the vertex Ti above the gate insulating film 42, the side surface 37 can be tilted relative to a Z axis. Accordingly, the contacts provided to the contact hole 54 can be easily filled up to a lower end of the contact hole 54.

Figure 4A:
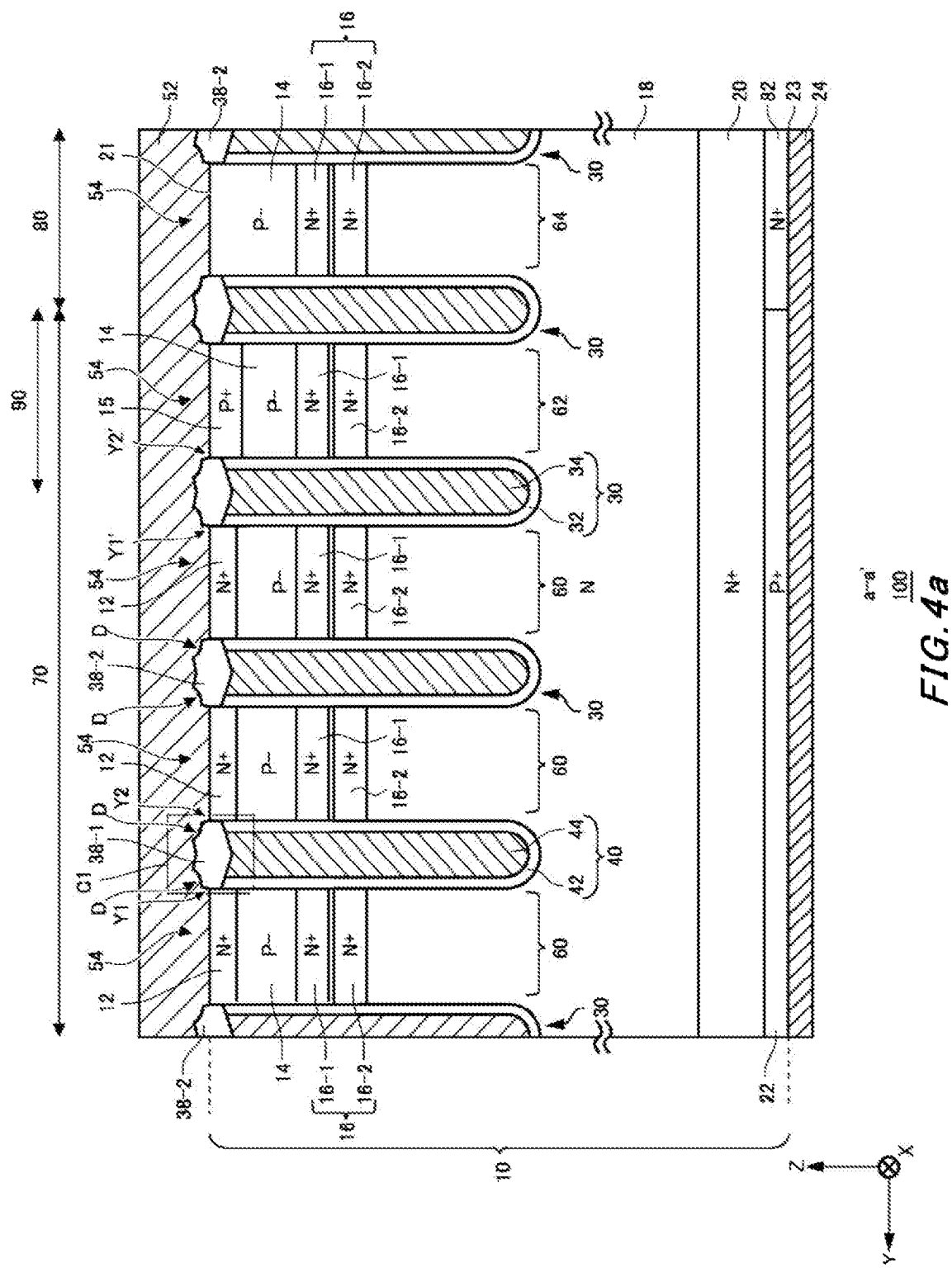

FIG. 4a illustrates another example of the cross section taken along a-a' in FIG. 1a. A semiconductor device 100 of FIG. 4a is different from the semiconductor device 100 of FIG. 1c in a shape of an interlayer dielectric film 38. Other structures of the semiconductor device 100 of FIG. 4a are the same as those of the semiconductor device 100 of FIGS. 1a to 3. In the present example, a depression D is formed on an upper surface of an upper portion of the interlayer dielectric film 38 provided above the upper surface 21. The depression D may have a shape convex downward. The depression D may be convex toward an inner side of the interlayer dielectric film 38. The inner side of the interlayer dielectric film 38 is defined as a side close to the center of the interlayer dielectric film 38 in the Y-axis direction. The interlayer dielectric film 38 of the present example has two depressions D arranged across the center of the interlayer dielectric film 38 in the Y-axis direction. The two depressions D may be symmetric based on an X-Z plane passing through the center of the trench section in the Y-axis direction.

The depression D is provided to at least one of the interlayer dielectric film 38-1 of the gate trench section 40 and the interlayer dielectric film 38-2 of the dummy trench section 30. Shapes of the depression D provided to the interlayer dielectric film 38-1 and the interlayer dielectric film 38-2 may be the same or different. By providing the depression D to the interlayer dielectric film 38, the contacts are easily filled up to a lower end of the contact holes 54. This can reduce a contact resistance between the contacts, and the emitter region 12 and the contact region 15.

Figure 4B:
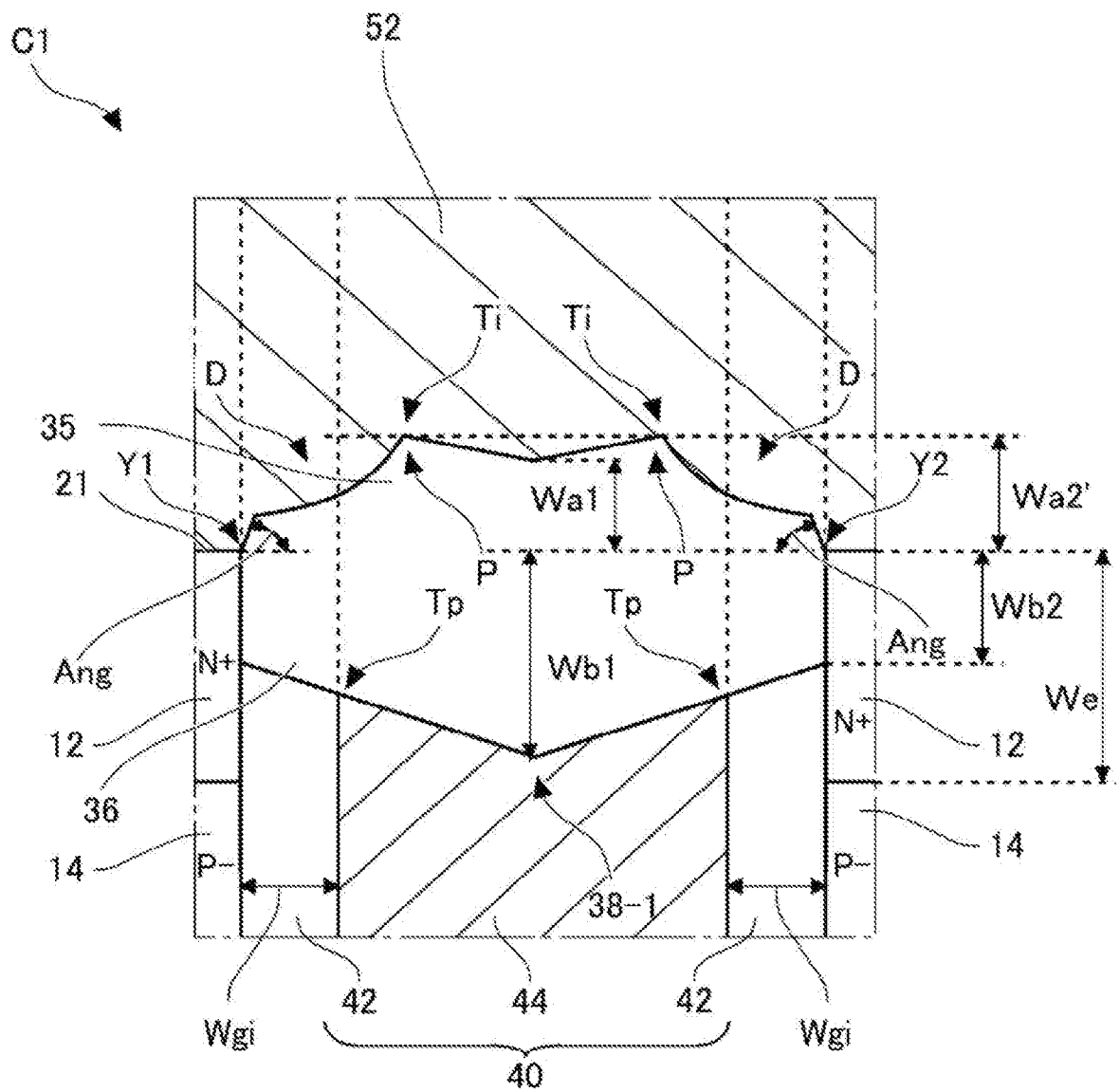

FIG. 4b is an enlarged view of a region C1 in FIG. 4a. The depression D is provided on the upper surface of the upper portion 35 of the interlayer dielectric film 38-1. Each depression D is arranged in a region not including the center of the interlayer dielectric film 38-1 in the Y-axis direction. As illustrated in FIG. 4b, at least a part of the depression D may be arranged above the gate conductive section 44 in the Z-axis direction. The depression D of the present example is continuous from above the gate insulating film 42 to above the gate conductive section 44. The upper surface of the depression D above the gate insulating film 42 is below the upper surface of the depression D above the gate conductive section 44. A vertex Ti is provided to an inner end among ends of the depression D in the Y-axis direction. The inner side refers to a side close to the center of the interlayer dielectric film 38 in the Y-axis direction. That is, the vertex Ti is provided above the gate conductive section 44 in the Z-axis direction.

The depression D of the interlayer dielectric film 38 of the semiconductor device 100 of the present example may be formed by etching the vicinity of the vertex Ti of the interlayer dielectric film 38 in FIG. 3. A thickness Wa2' of the interlayer dielectric film 38 with the depression D may be smaller than a thickness Wa2 of the interlayer dielectric film 38 without the depression D. The semiconductor device 100 may include the interlayer dielectric film 38 with the depression D and the interlayer dielectric film 38 without the depression D. The width Wa2' becomes smaller than the width Wa2 in FIG. 3 if the depression D is formed by etching the vicinity of the vertex Ti of the interlayer dielectric film 38 in FIG. 3.

Figure 5A:
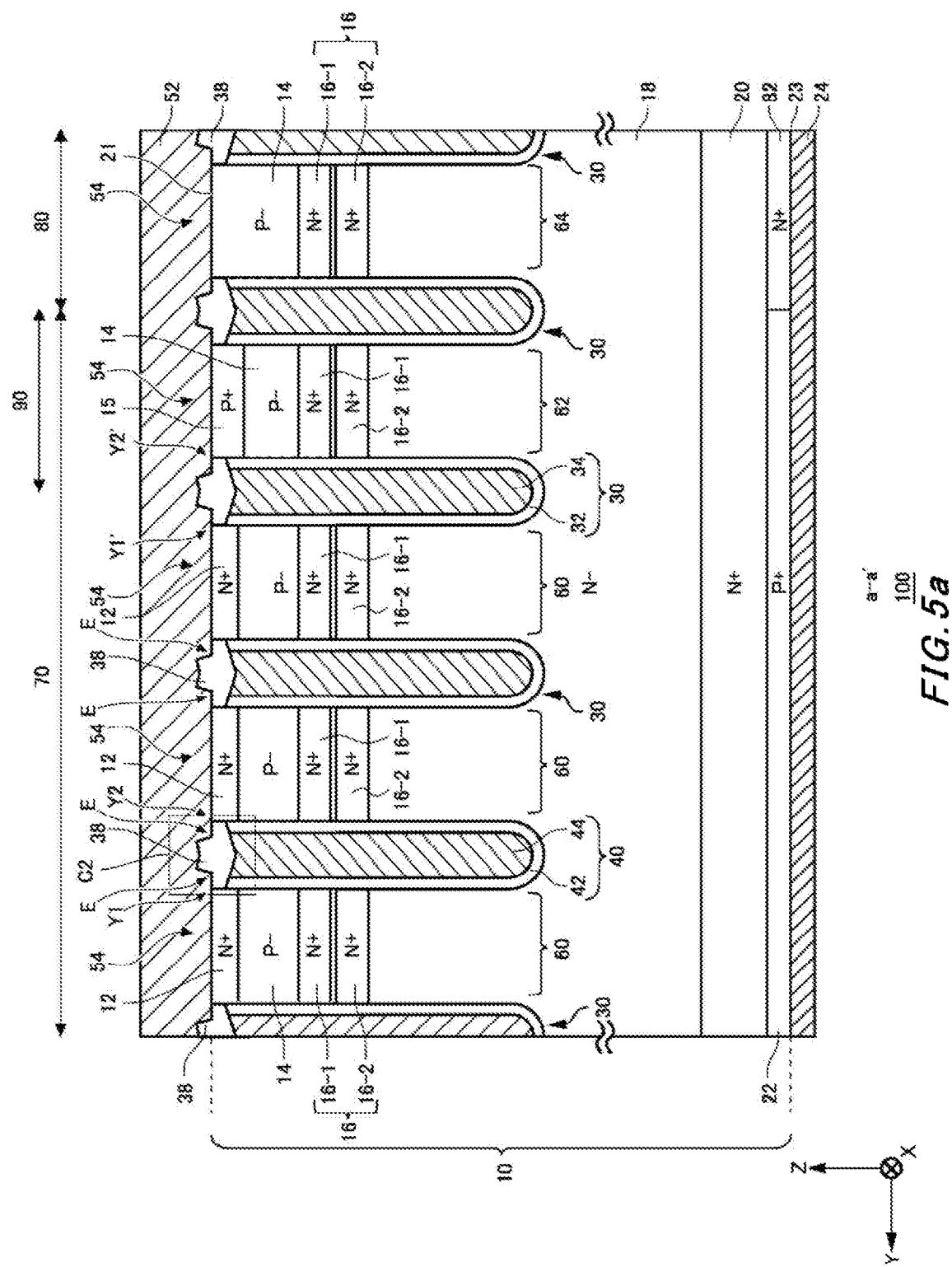

FIG. 5a illustrates another example of the cross section taken along a-a' in FIG. 1a. A semiconductor device 100 of FIG. 5a differs from the semiconductor device 100 of FIG. 1c in a shape of an interlayer dielectric film 38. Other structures of the semiconductor device 100 of FIG. 5a are the same as those of the semiconductor device 100 illustrated in FIG. 1a to FIG. 4b. The interlayer dielectric film 38 of the present example has a plane parallel to the upper surface 21 at substantially the same position as the upper surface 21 in the Z-axis direction. The parallel plane may be coplanar with the upper surface 21. In the semiconductor device 100 illustrated in FIG. 5a, a width of the interlayer dielectric film 38 above the upper surface 21 in the Y-axis direction is smaller than a width of the gate trench section 40 and the dummy trench section 30 in the Y-axis direction. A bottom surface of a contact hole 54 may be continuous in the Y-axis direction above a first mesa section 60 and above a gate trench section 40 and a dummy trench section 30. The bottom surface of the contact hole 54 is coplanar with the upper surface 21. The contact hole 54 may extend above the gate conductive section 44 or the dummy conductive section 34.

In an example of each figure, the interlayer dielectric films 38 provided above individual trench sections may be symmetric based on an X-Z plane passing through the center of the trench section in the Y-axis direction. In the a-a' cross section, the interlayer dielectric films 38 may be line-symmetric based on a line parallel to the Z axis passing through the center of the trench section. The interlayer dielectric film 38 illustrated in each figure may have the same shape as the a-a' cross section in a YZ cross section other than the a-a' cross section.

An end portion E is an end of the bottom surface of the contact hole 54 in the Y-axis direction. In the present example, the end portion E is provided above each trench section.

The bottom surface of the contact hole 54 of the present example is also provided above each trench section. This allows increasing a width of the upper surface 21 of the contact hole 54 in the Y-axis direction. This allows arranging the vicinity of the end portion E which is relatively difficult to be filled with the contacts above each trench section. This allows a contact between each mesa section and contacts provided to the contact hole 54 more reliably.

Figure 5B:
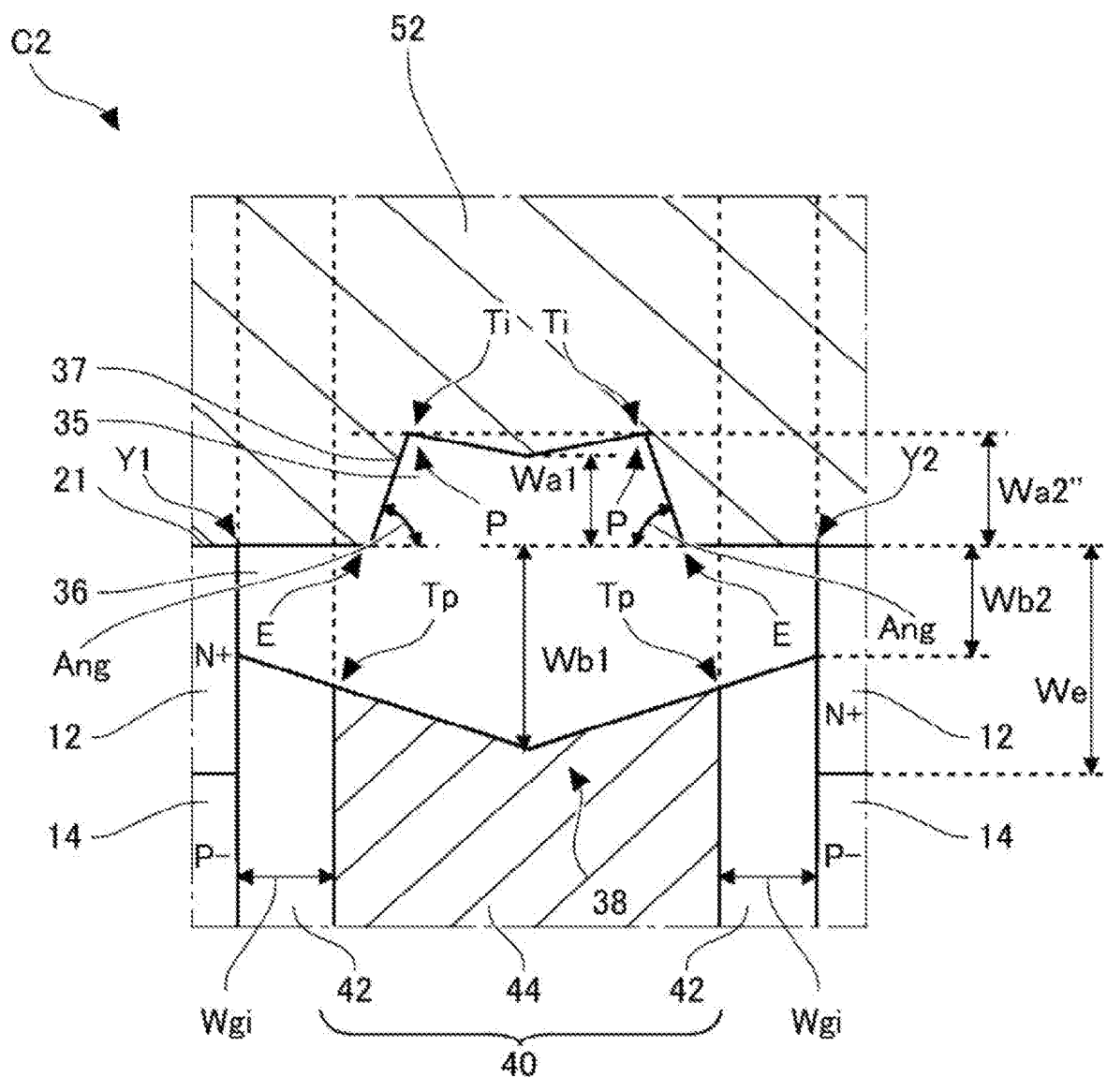

FIG. 5b is an enlarged view of a region C2 in FIG. 5a. In the present example, a portion above the upper surface 21 of the interlayer dielectric film 38 is defined as an upper portion 35, and a portion below the upper surface 21 is defined as a lower portion 36. As illustrated in FIG. 5b, the upper portion 35 is provided only in a partial region above the gate conductive section 44. That is, above the gate conductive section 44, there is a region where the upper portion 35 is not provided and the contact hole 54 is provided. In the present example, the upper portion 35 of the interlayer dielectric film 38 is not provided above the upper end Tp of the gate conductive section 44.

The upper portion 35 of the interlayer dielectric film 38 may include a convex P illustrated in FIG. 1a to FIG. 4b. The convex P is convex upward. The convex P of the present example is arranged above the gate conductive section 44. The upper portion 35 may have the depression D illustrated in FIG. 4a and FIG. 4b. The depression D is also arranged above the gate conductive section 44.

Individual vertices Ti may be arranged closer to the center of the gate conductive section 44 in the Y-axis direction than the upper ends Tp. That is, the vertex Ti may be arranged above the gate conductive section 44. Individual vertices Ti may be provided to positions symmetric based on the center of the gate trench section 40 in the Y-axis direction.

The interlayer dielectric film 38 of the present example may be formed by etching the vicinity of the vertex Ti of the interlayer dielectric film 38 after forming the interlayer dielectric film 38 illustrated in FIG. 3 or the like. A width Wa2" of the upper portion 35 illustrated in FIG. 5b is smaller than a width Wa2" illustrated in FIG. 3. The width Wa2" may be equal to the width Wa2' in FIG. 4b and may be smaller or larger than the width Wa2'. The semiconductor device 100 may include the interlayer dielectric film 38 of a plurality of types of shapes shown in each figure.

An angle Ang formed between a side surface 37 of the upper portion 35 and the upper surface 21 may be 20 degrees or more and 60 degrees or less as similar to the indicate illustrated in FIG. 3. More preferably, the angle Ang may be 30 degrees or more and 50 degrees or less.

Each end portion E may be arranged above the gate conductive section 44. Individual end portions E may be provided to positions symmetric based on the center of the gate trench section 40 in the Y-axis direction.

In the semiconductor device 100 of the present example, the end portion E is arranged above the gate conductive section 44, and this allows increasing a width of the contact hole 54 in the Y-axis direction than a mesa width Wm of a first mesa section. This allows reducing a contact resistance between the contacts provided to the contact hole 54 and the emitter region 12 and the contact region 15.

In the semiconductor device 100 of the present example, the contacts provided to the contact hole 54 do not contact to the gate conductive section 44 because even if the upper portion 35 of the interlayer dielectric film 38 is arranged only in a part above the gate conductive section 44, the lower portion 36 of the interlayer dielectric film 38 is provide inside the trench. This allows suppressing a GE short. Therefore, in the semiconductor device 100 of the present example, the GE short can be suppressed while narrowing the mesa width Wm.

Figure 6A:
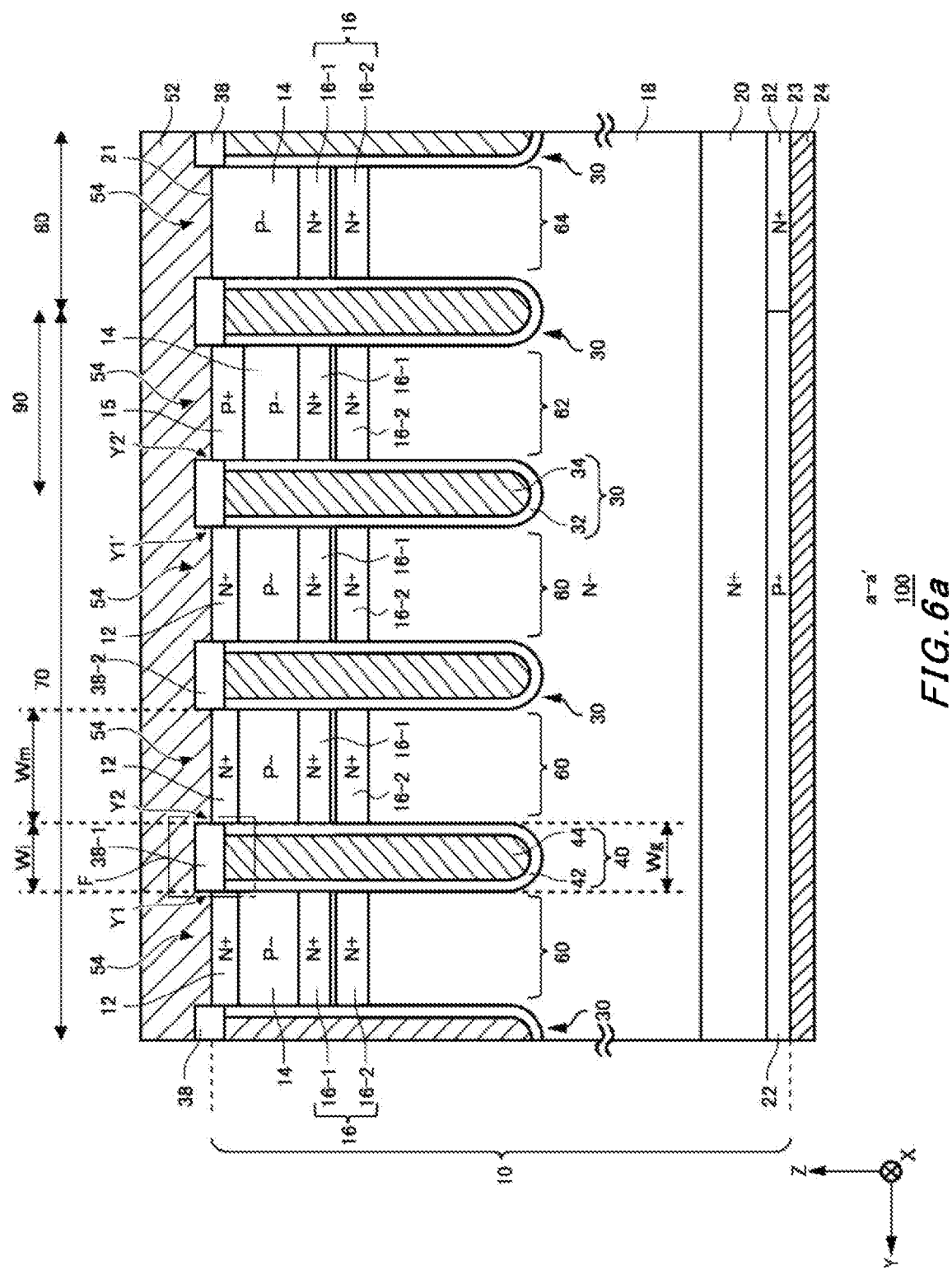

FIG. 6a illustrates another example of a cross section taken along a-a' in FIG. 1a. A semiconductor device 100 illustrated in FIG. 6a differs from the semiconductor device 100 illustrated in FIG. 1b in that upper surfaces of a gate conductive section 44 and a dummy conductive section 34 are parallel to the upper surface 21 and an upper surface of an interlayer dielectric film 38 is parallel to the upper surface 21. In the semiconductor device 100 of the present example, a lower surface of the interlayer dielectric film 38 may be arranged below the upper surface 21. The upper surface of the interlayer dielectric film 38 is arranged above the upper surface 21.

The upper surface of the gate conductive section 44 may be produced by CMP (Chemical-Mechanical Polishing) and dry etching. For example, the gate conductive section 44 in the gate trench section 40 may be dry etched after polishing the upper surface with the CMP until the gate conductive section 44 comes to have the same height as the upper surface 21. By the dry etching, a plane parallel to the upper surface 21 can be easily produced on an upper surface of the gate trench section 40 because a difference in etching rates at a central part and a peripheral part of the gate trench section 40 is small.

A side surface of the interlayer dielectric film 38 may be perpendicular to the upper surface 21 of the semiconductor substrate 10. A width Wi of the upper surface of the interlayer dielectric film 38 in the Y-axis direction may be equal to a width Wg of the gate trench section 40 in the Y-axis direction. A distance between side surfaces of two adjacent interlayer dielectric films 38 in the Y-axis direction (for example, interlayer dielectric film 38-1 and interlayer dielectric film 38-2) may be equal to a mesa width Wm.

Figure 6B:
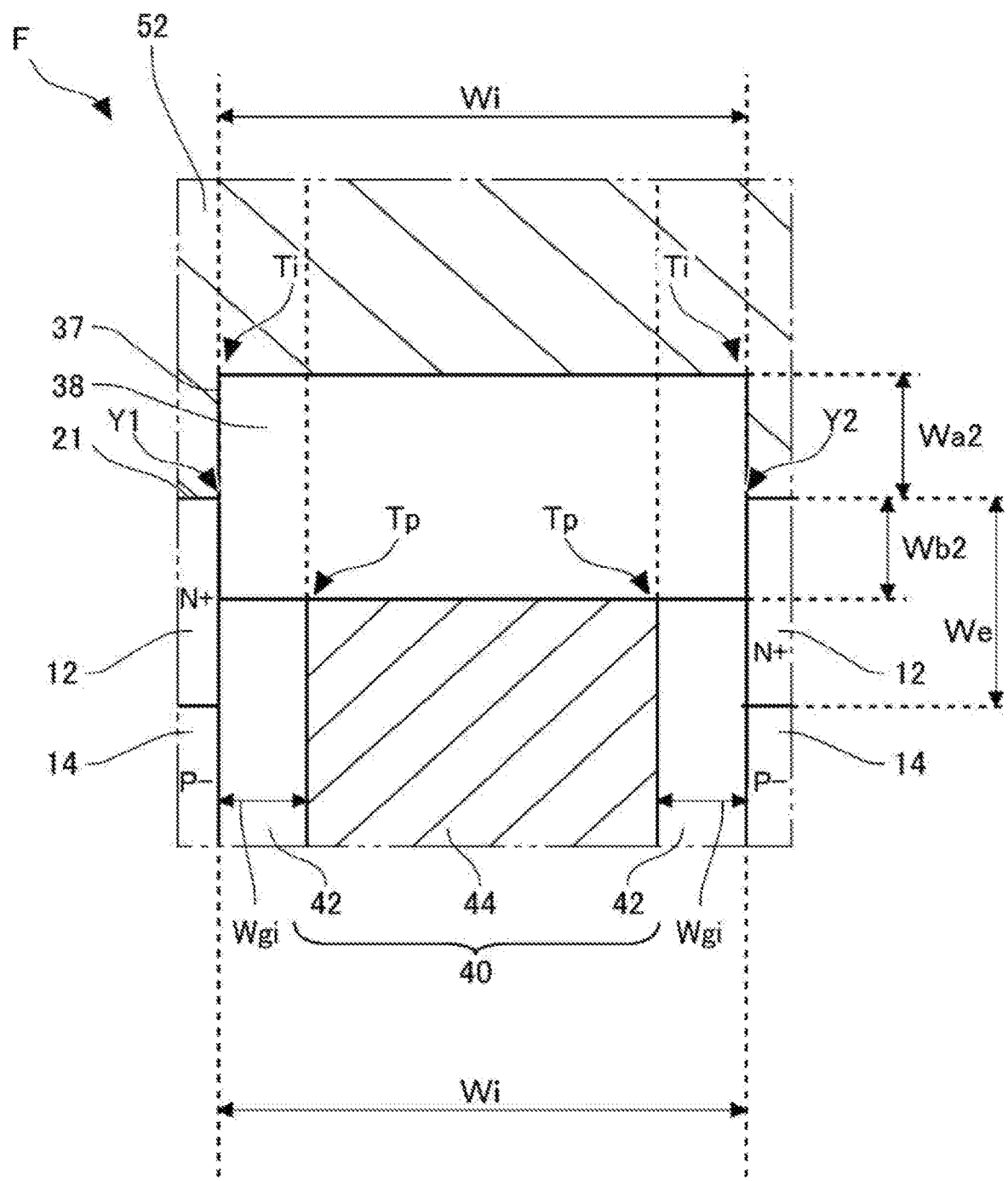

FIG. 6b is an enlarged view of a region F in FIG. 6a. As illustrated in FIG. 6b, a thickness Wa2 is a thickness of a portion of the interlayer dielectric film 38 provided above the upper surface 21. A thickness Wb2 is thickness of a portion of the interlayer dielectric film 38 provided below the upper surface 21. The upper end Tp of the gate conductive section 44 may be provided below the upper surface 21. The width Wb2 may be 1.5 times or more and 3.5 times or less of the width Wgi. The width Wb2 may be equal to the width Wa2 and may be larger or smaller than the width Wa2.

The upper end Tp may be provided at the same position as the upper surface 21 in the Z-axis direction. That is, the thickness Wb2 may be zero.

In the present example, a contact resistance between the emitter electrode 52 and each mesa section can be reduced by making the width of the contact hole 54 equal to the mesa width Wm. Further, the GE short can be suppressed by arranging the upper end Tp of the gate conductive section 44 below the upper surface 21. This allows suppressing the occurrence of the GE short while reducing the contact resistance between contacts, and the emitter electrode 52 and the contact region 15. This allows reducing the width Wm.

Figure 7:
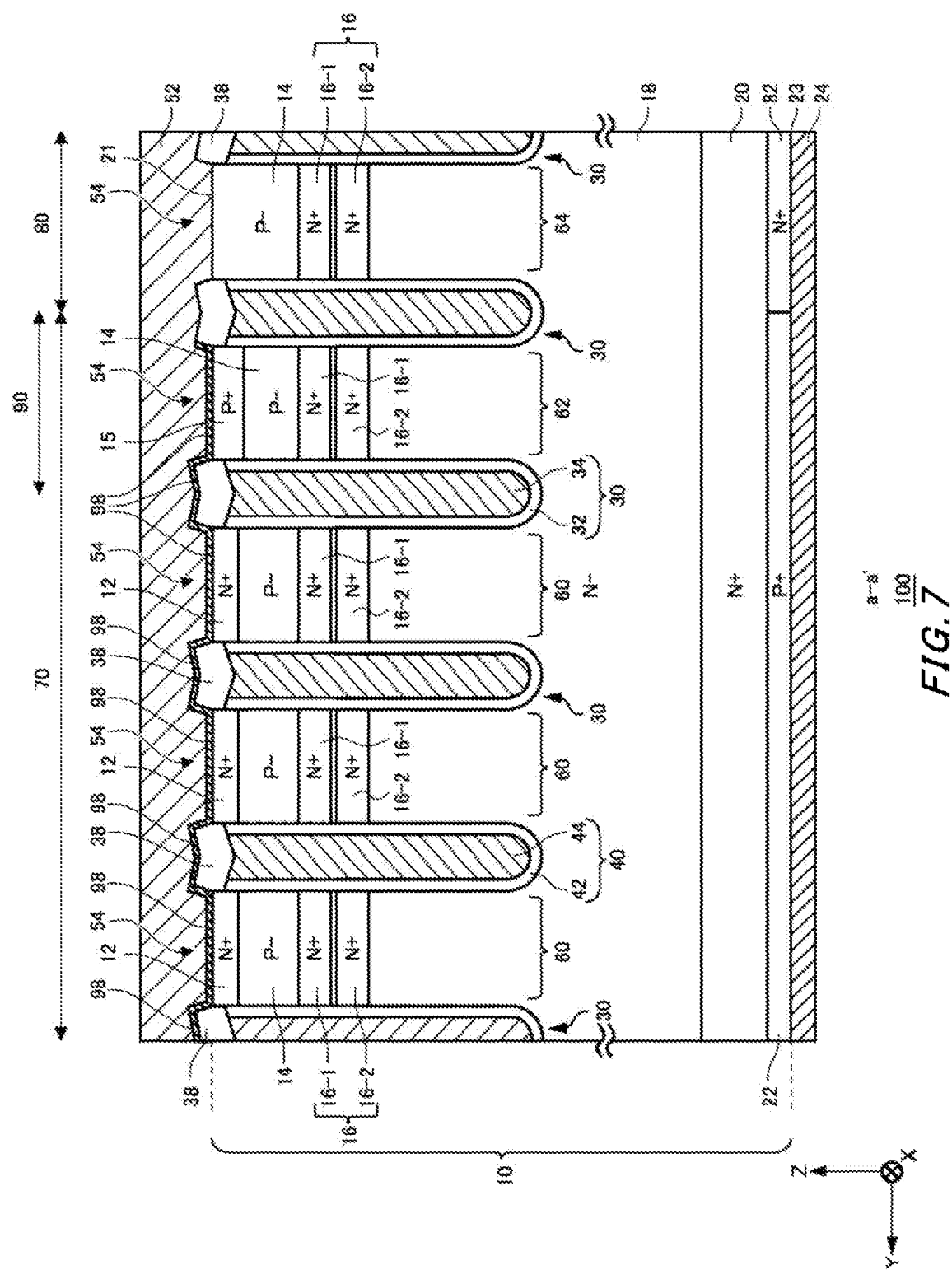

FIG. 7 illustrates another example of a cross section taken along a-a' in FIG. 1a. A semiconductor device 100 illustrated in FIG. 7 differs from the semiconductor device 100 illustrated in FIG. 1b in that a barrier metal 98 is provided to a transistor sections 70. The barrier metal 98 may be provides on a bottom surface of a contact hole 54. The barrier metal 98 may also be provided on an upper surface and a side surface of an interlayer dielectric film 38. The barrier metal 98 may be continuous on an upper surface of a first mesa section 60, an upper surface of a second mesa section 62, and the upper surface and the side surface of the interlayer dielectric film 38 in the Y-axis direction. A diode section 80 may not be provided with the barrier metal 98. The barrier metal 98 can be applied to the semiconductor device 100 of each aspect illustrated in FIG. 1a to FIG. 6b.

Contacts provided to the contact hole 54 can be formed of, as one example, aluminum (Al). The barrier metal 58 suppresses the diffusion of the aluminum into the semiconductor substrate 10. As one example, the barrier metal 98 can be formed of at least one of titanium (Ti) and titanium nitride (TiN).

Figure 8:
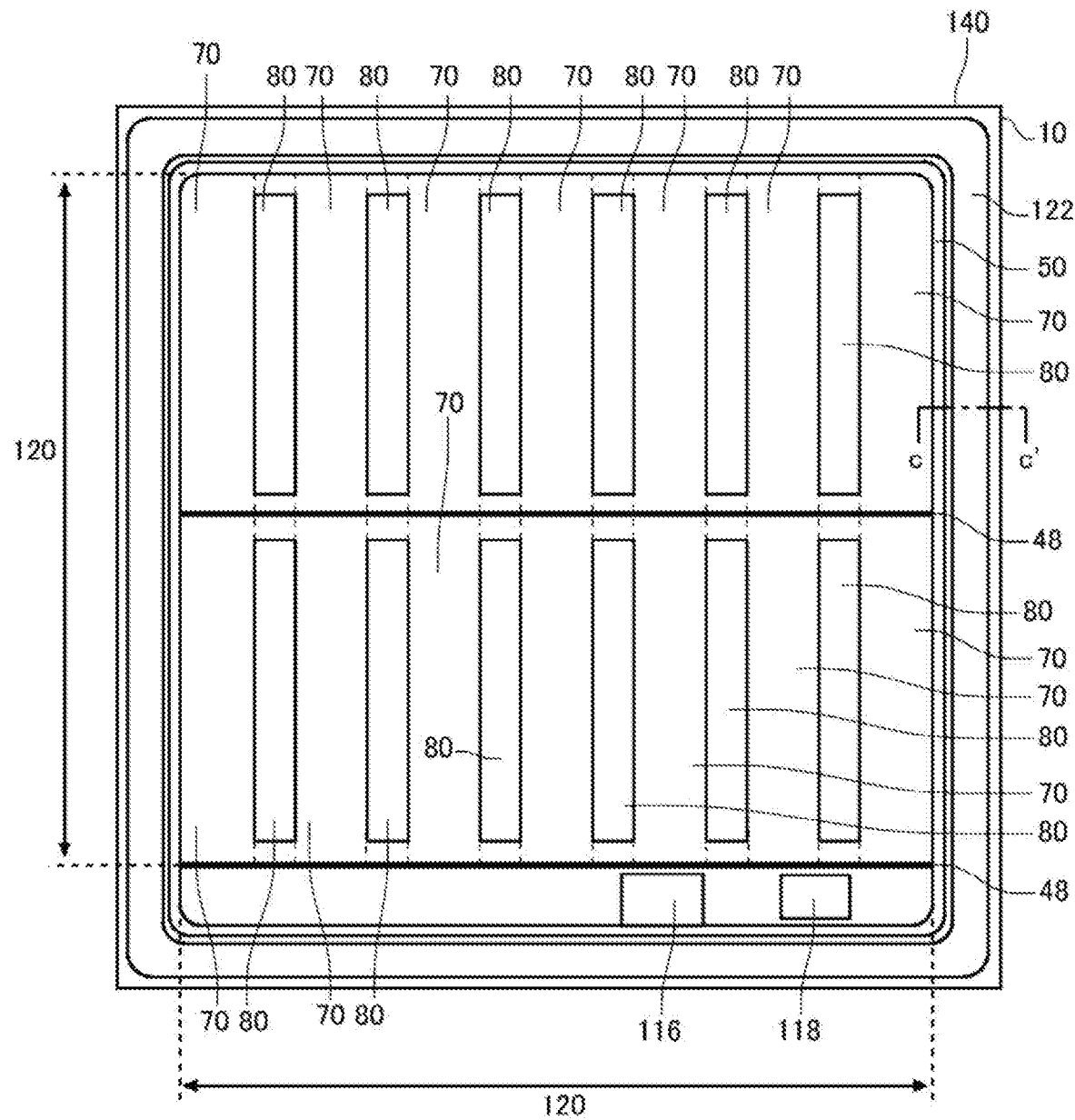
FIG. 8 illustrates one example of an upper surface of a semiconductor chip 200 according to the present embodiment.

FIG. 8 illustrates one example of an upper surface of a semiconductor chip 200 according to the present embodiment. The semiconductor chip 200 includes a semiconductor substrate 10. A periphery 140 is an end of an outer periphery of the semiconductor substrate 10.

The semiconductor chip 200 includes an active section 120 and an edge termination structure section 122. The active section 120 is a region in which a main current flows between an upper surface and a lower surface of the semiconductor substrate 10 when the semiconductor device 100 is controlled in an ON state. That is, the active section 120 is a region in which a current flows from the upper surface to the lower surface of the semiconductor substrate 10 or from the lower surface to the upper surface in a depth direction in the semiconductor substrate 10.

A transistor section 70 and a diode sections 80 are provided in the active section 120. A gate runner 48 may surround the transistor sections 70 and the diode sections 80 in a top view of FIG. 8. In an example of FIG. 8, the active section 120 includes a region where the gate runner 48 is provided.

The transistor sections 70 include a transistor such as an IGBT. The diode sections 80 are alternately arranged with the transistor sections 70 in a predetermined arrangement direction (in the present example, Y-axis direction) on the upper surface 21 of the semiconductor substrate 10.

A cathode region 82 is provided in a region of each diode section 80 in contact to a lower surface 23 of the semiconductor substrate 10. In FIG. 8, the diode sections 80 indicated by solid lines are regions of the lower surface 23 of the semiconductor substrate 10 where the cathode region 82 is provided. In the semiconductor device 100 of the present example, a collector region 22 is provided in a region other than the cathode region 82 among regions in contact to the lower surface 23 of the semiconductor substrate 10.

The diode section 80 is a region where the cathode region 82 is projected in the Z-axis direction. The transistor section 70 is a region in which the collector region 22 is provided on the lower surface 23 of the semiconductor substrate 10 and unit structures including the emitter region 12 on the upper surface 21 of the semiconductor substrate 10 are periodically provided. A boundary between the diode section 80 and the transistor section 70 in the Y-axis direction is a boundary between the cathode region 82 and the collector region 22. The diode section 80 may include a portion obtained by extending a region in which the cathode region 82 is projected in the Z-axis direction to an end of the active section 120 or the gate runner 48 in the X-axis direction (in FIG. 8, indicated by dashed lines obtained by extending solid lines of the diode sections 80 in the X-axis direction).

The transistor sections 70 may be provided to both ends of the active section 120 in the Y-axis direction. The active section 120 may be divided in the X-axis direction by the gate runner 48 extending in the Y-axis direction. In each divided region of the active section 120, the transistor sections 70 and the diode sections 80 may be alternately arranged in the Y-axis direction.

The edge termination structure section 122 is provided between the active section 120 and the periphery 140 of the semiconductor substrate 10 on the upper surface 21 of the semiconductor substrate 10. The edge termination structure section 122 may be arranged in a circular pattern to surround the active section 120 on the upper surface 21 of the semiconductor substrate 10. The edge termination structure section 122 of the present example is arranged along the periphery 140 of the semiconductor substrate 10. The edge termination structure section 122 relaxes the electric field concentration at the upper surface 21 side of the semiconductor substrate 10. The edge termination structure section 122 has a structure of a guard ring, a field plate, a RESURF, and a combination thereof, for example.

A gate metal layer 50 is provided between the edge termination structure section 122 and the active section 120 on the upper surface 21 of the semiconductor substrate 10. The gate metal layer 50 is electrically connected to the transistor sections 70 to supply gate voltages to the transistor sections 70. Although an interlayer dielectric film 38 is provided between the gate metal layer 50 and the semiconductor substrate 10, it is omitted in FIG. 8.

The gate metal layer 50 may be provided to surround the active section 120 in a top view of the semiconductor substrate 10. The gate metal layer 50 is electrically connected to a gate pad 116 provided outside the active section 120. The gate pad 116 may be arranged between the gate metal layer 50 and the active section 120. A pad such as an emitter pad 118 electrically connected to an emitter electrode may be provided between the gate metal layer 50 and the active section 120.

Figure 9:
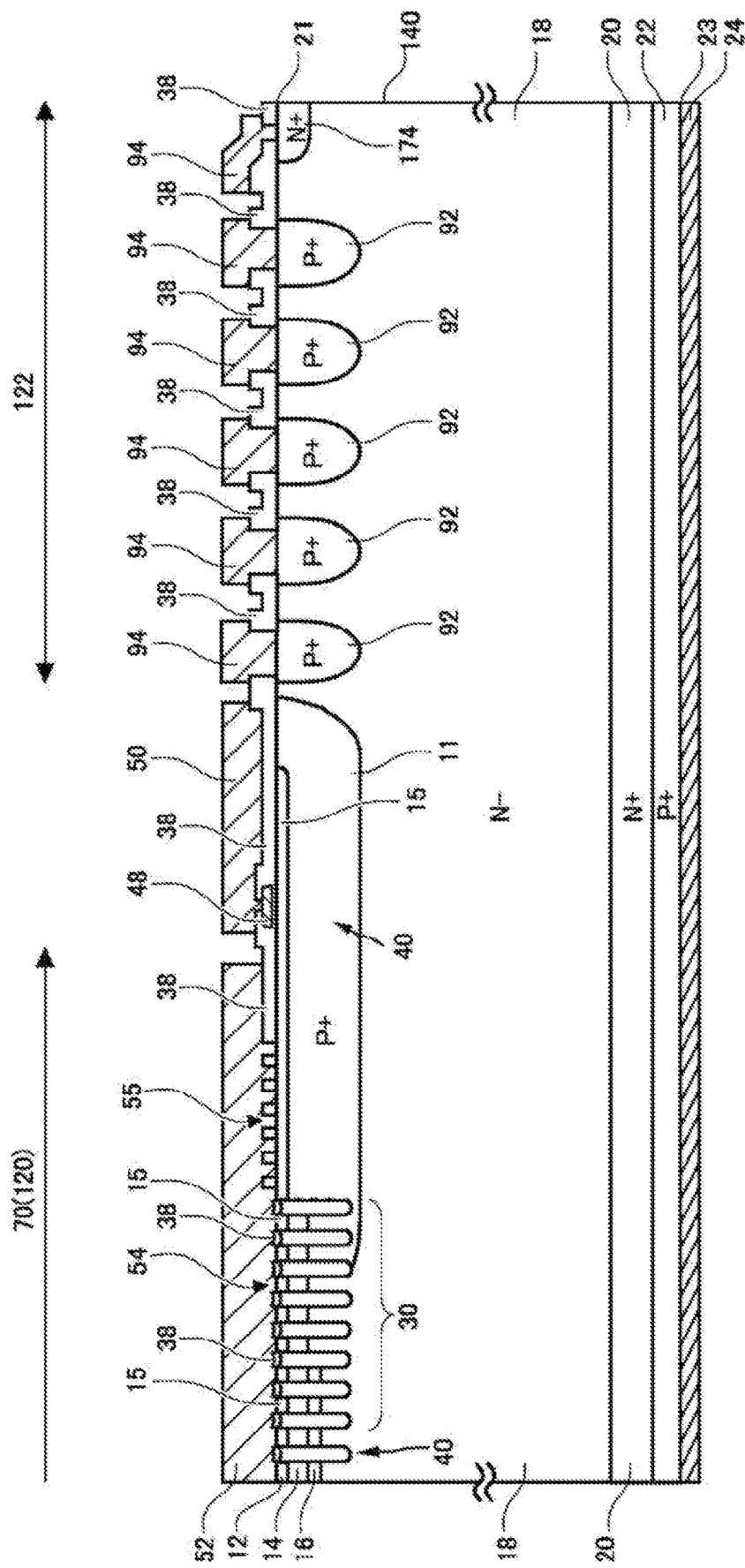
FIG. 9 illustrates one example of a cross section taken along c-c' in FIG. 8.

The gate runner 48 is electrically connected to the gate metal layer 50, and extends to above the active section 120. At least one gate runner 48 may extend in the Y-axis direction through the active section 120. The gate runner 48 supplies a gate voltage to the transistor sections 70. The gate runner 48 may be formed of a semiconductor material such as polysilicon doped with impurities, or may be formed of metal. The gate runner 48 is formed above or inside the semiconductor substrate 10, and the semiconductor substrate 10 and the gate runner 48 are insulated from each other by an insulating film FIG. 9 illustrates one example of a cross section taken along c-c' in FIG. 8. The c-c' cross section is a Y-Z plane including a transistor section 70 and an edge termination structure section 122.

In the c-c' cross section, a semiconductor device 100 of the present example includes a semiconductor substrate 10, an interlayer dielectric film 38, a gate metal layer 50, a field plate 94, an emitter electrode 52, and a collector electrode 24. The interlayer dielectric film 38 covers at least a part of the upper surface 21. A through hole such as a contact hole 54 is provided to the interlayer dielectric film 38. The upper surface 21 that is exposed through the contact hole 54.

The emitter electrode 52 is provided on the upper surface 21 and on an upper surface of the interlayer dielectric film 38 in the transistor section 70. The emitter electrode 52 is also provided inside the contact hole 54. The emitter electrode 52 contacts to the upper surface 21 that is exposed through the contact hole 54.

The collector electrode 24 is provided on a lower surface 23 of the semiconductor substrate 10. The collector electrode 24 may contact to the entire lower surface 23. The emitter electrode 52 and the collector electrode 24 are formed of a conductive material such as metal.

The edge termination structure section 122 includes a plurality of guard rings 92, a plurality of field plates 94, and a channel stopper 174. Each guard ring 92 may surround the active section 120 on the upper surface 21. The plurality of guard rings 92 may have a function of spreading a depletion layer generated in the active section 120 to the outside of the semiconductor substrate 10. This can prevent an electric field concentration in the semiconductor substrate 10 and improve a breakdown voltage of the semiconductor device 100.

The guard ring 92 of the present example is a (P+)-type semiconductor region formed by implanting ion in the vicinity of the upper surface 21. A bottom portion of the guard ring 92 may have the same depth as a bottom portion of a well region 11. A bottom portion of the guard ring 92 of the present example may be located deeper than bottom portions of a gate trench section 40 and a dummy trench section 30.

The interlayer dielectric film 38 covers an upper surface of the guard ring 92. The field plate 94 is made of a conductive material such as metal or polysilicon. The field plate 94 may be formed of the same material as the gate metal layer 50 or the emitter electrode 52. The field plate 94 is provided on the interlayer dielectric film 38. The field plate 94 is connected to the guard ring 92 through a through hole provided to the interlayer dielectric film 38.

The channel stopper 174 is exposed at the upper surface 21 and a side surface at the periphery 140. The channel stopper 174 is an N-type region having a higher doping concentration than the drift region 18. The channel stopper 174 has a function of terminating a depletion layer generated in the active section 120 at the periphery 140 of the semiconductor substrate 10.

A well region 11, a gate runner 48, and a gate metal layer 50 are provided between the active section 120 and the edge termination structure section 122. The well region 11 may be exposed at the upper surface 21. The interlayer dielectric film 38 may cover an upper surface of the well region 11. The well region 11 may extend to the active section 120. Some trench sections in the active section 120 may be formed in the well region 11. In the present example, the transistor sections 70 are arranged to both ends of the active section 120 in the Y-axis direction. One or more dummy trench sections 30 may be arranged between a gate trench section 40 arranged closest to the gate metal layer 50 in the transistor sections 70 and the gate metal layer 50. At least one of dummy trench section 30 may be arranged in the well region 11.

One or more contact holes 55 may be provided between a trench section arranged closest to the gate metal layer 50 in the transistor sections 70 and the gate metal layer 50. Through the contact hole 55, the well region 11 and the emitter electrode 52 are electrically connected. The well region 11 may have a contact region 15 having a higher doping concentration than the well region 11 at a position in contact to the contact hole 55.

The gate runner 48 may be provided on the upper surface 21. The interlayer dielectric film 38 is provided on an upper surface of the gate runner 48. A gate metal layer 50 is arranged on the interlayer dielectric film 38. The well region 11 is preferably provided in a range wider than the gate metal layer 50 in the Y-axis direction.

The collector region 22 is provided in a region in contact to the lower surface 23 in the transistor sections 70. The collector region 22 may be provided in a region in contact to the lower surface 23 between the transistor section 70 and the periphery 140.

Figure 10:
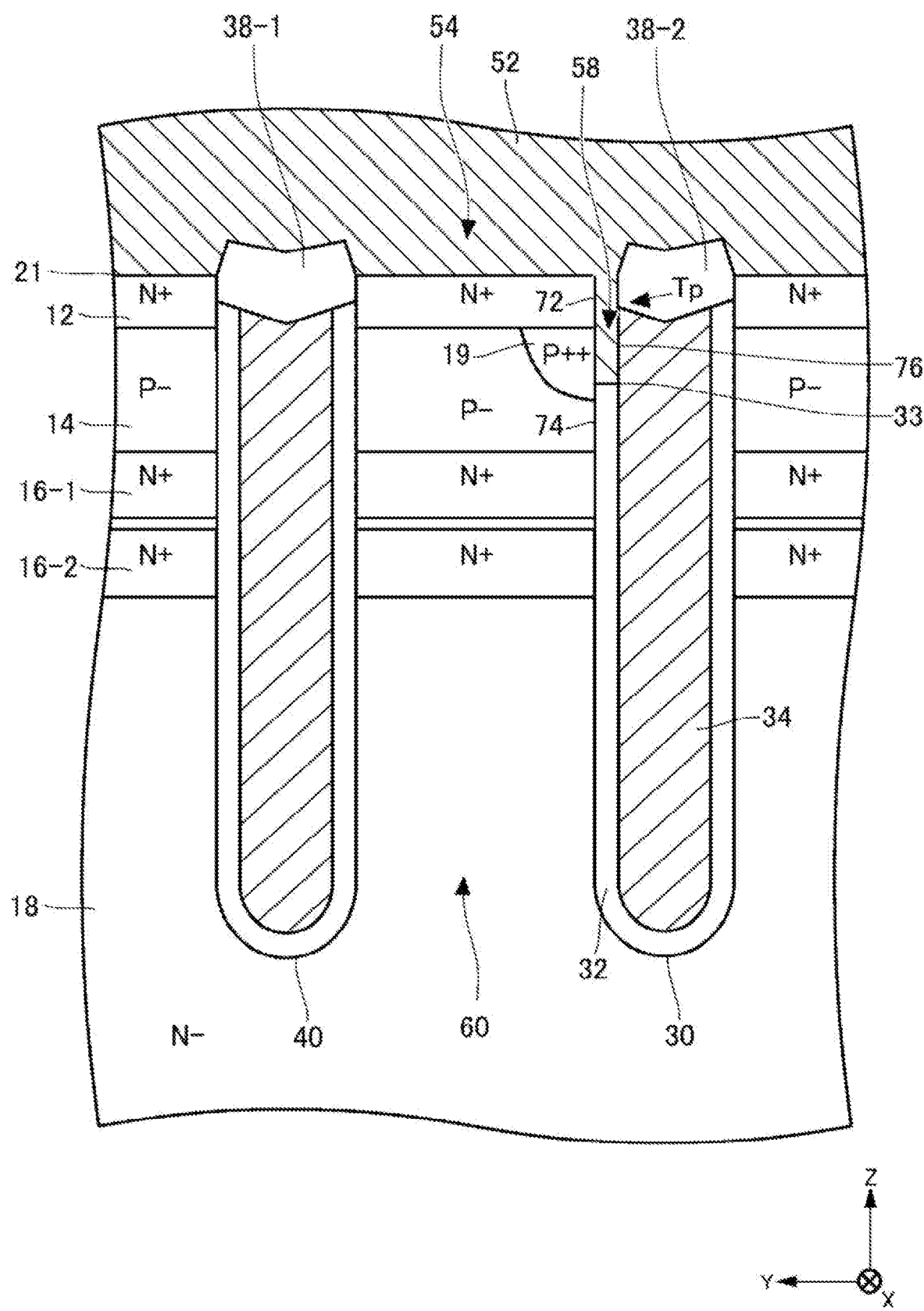
FIG. 10 illustrates another exemplary structure of a dummy trench section 30 and an interlayer dielectric film 38-2.

FIG. 10 illustrates another exemplary structure of a dummy trench section 30 and an interlayer dielectric film 38-2. A semiconductor device of FIG. 10 and the semiconductor device 100 of any aspect illustrated in FIG. 1a to FIG. 9 may be the same in structures other than the dummy trench section 30 and the interlayer dielectric film 38-2.

The dummy trench section 30 of the present example is adjacent to a gate trench section 40 in the Y-axis direction. As one example, the dummy trench section 30 is provided in the transistor section 70.

The dummy trench section 30 includes an inner wall 74 facing the gate trench section 40. The inner wall 74 is a boundary between the semiconductor substrate 10 and the dummy trench section 30. The dummy insulating film 32 is provided between the inner wall 74 and the dummy conductive section 34. In examples of FIG. 1a to FIG. 9, the dummy insulating film 32 covers the entire side surface 76 of the dummy conductive section 34. The side surface 76 of the dummy conductive section 34 faces the inner wall 74 of the dummy trench section 30. In the present example, the inner wall 74 and the side surface 76 are planes parallel to the X axis.

The dummy insulating film 32 of the present example does not cover the upper end portion of the side surface 76 of the dummy conductive section 34 which is in contact to the interlayer dielectric film 38-2 and causes the upper end portion to be exposed. An upper end 33 of the dummy insulating film 32 in a region sandwiched between the inner wall 74 and the side surface 76 is below an upper end Tp of the dummy conductive section 34. The upper end 33 of the dummy insulating film 32 may be below a lower end of a portion in which the emitter region 12 is in contact to the inner wall 74. In this case, the entire side surface 72 of the emitter region 12 is not covered by the dummy insulating film 32 and is exposed. The side surface 72 of the emitter region 12 faces the dummy trench section 30.

The dummy trench section 30 of the present example includes a contact extension section 58 formed of a conductive material. The contact extension section 58 extends from the emitter electrode 52 to a position in contact to the upper end 33 of the dummy insulating film 32. The contact extension section 58 may be formed of the same material as the emitter electrode 52 or may be formed of a different material. As one example, the contact extension section 58 is made of tungsten. This allows easily forming the contact extension section 58 in a region of a minute width.

The contact extension section 58 contacts to the side surface 72 of the emitter region 12. The contact extension section 58 may contact to an entire region that is not covered by the dummy insulating film 32 and is exposed of the side surface 72 of the emitter region 12. The contact extension section 58 may extend in the X-axis direction along the dummy trench section 30. That is, the contact extension section 58 may contact to side surfaces of contact regions 15 alternately arranged with the emitter regions 12 in the X-axis direction. According to the present example, a contact area between the emitter region 12 and the contact region 15 and a contact area between the emitter electrode 52 and the contact extension section 58 can be increased.

The contact extension section 58 may also contact to the side surface of the base region 14. This allows increasing a contact area between the base region 14, and the emitter electrode 52 and the contact extension section 58. A second conductivity type high concentration region 19 having a higher doping concentration than the base region 14 may be provided in a region in contact to the contact extension section 58 among the base region 14. The high concentration region 19 may have the higher doping concentration than the contact region 15. The high concentration region 19 of the present example is a P++ type.

The high concentration region 19 may be in contact to the emitter region 12. The high concentration region 19 may be provided up to below the upper end 33 of the dummy insulating film 32 on the inner wall 74. This can increase a contact area between the contact extension section 58 and the high concentration region 19.

The interlayer dielectric film 38-2 is not provided above the upper end 33 of the dummy insulating film 32. The interlayer dielectric film 38-3 may have a side surface flush with the side surface 76 of the dummy conductive section 34. The contact extension section 58 is provided also between the side surface of the interlayer dielectric film 38-2 and the semiconductor substrate 10 (for example, emitter region 12). This allows providing the contact extension section 58 from the emitter electrode 52 to the upper end 33 of the dummy insulating film 32.

The dummy trench section 30 illustrated in FIG. 10 includes the contact extension section 58 only on one side surface 76 in the Y-axis direction of side surfaces of the dummy conductive section 34. The dummy trench section 30 of another example may include contact extension sections 58 on both side surfaces of the dummy conductive section 34. That is, an upper end portion of the dummy conductive section 34 may be sandwiched by two contact extension sections 58.

Figure 11:
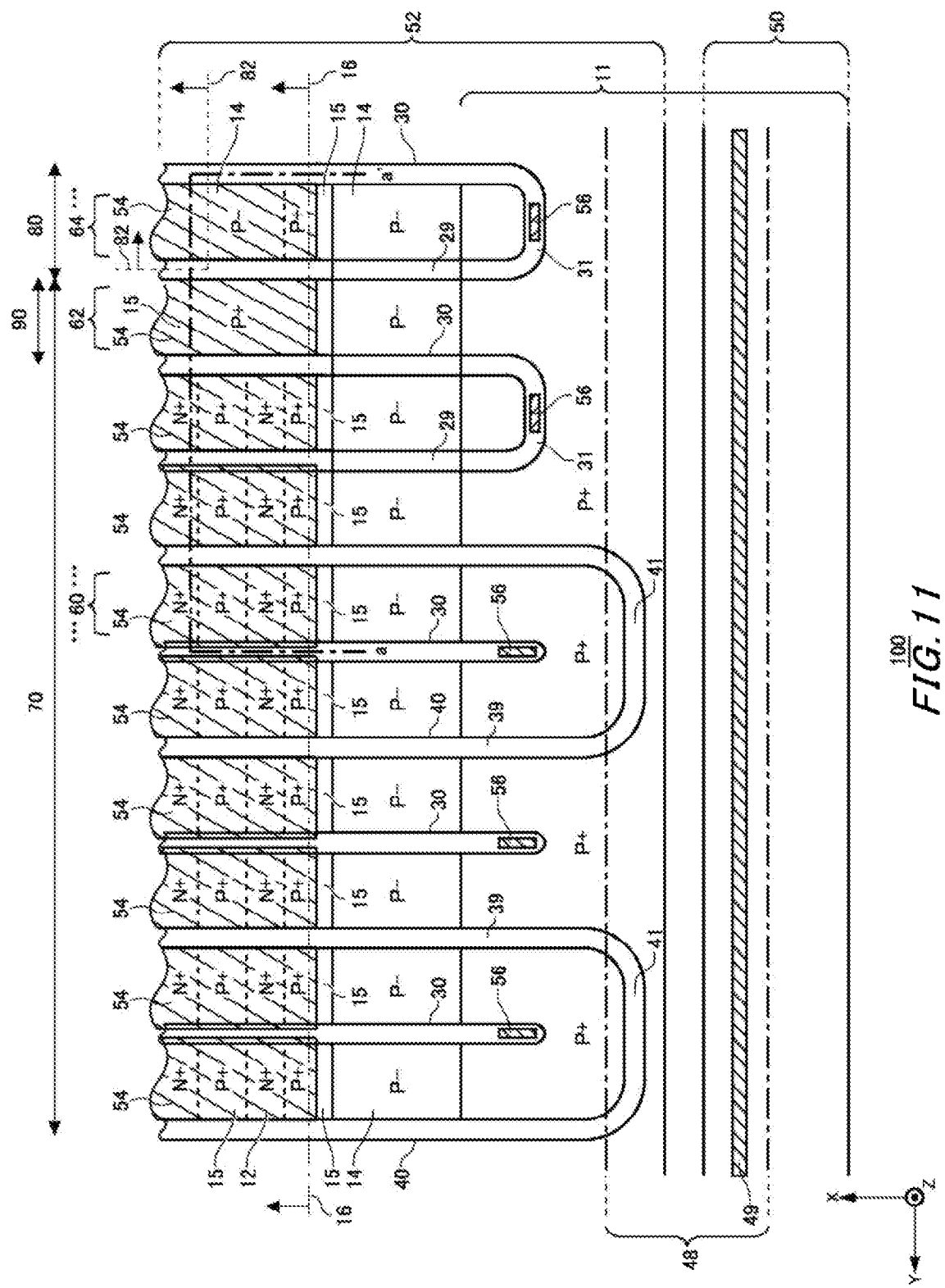
FIG. 11 is a top view illustrating an exemplary arrangement of a contact hole 54.

FIG. 11 is a top view illustrating an exemplary arrangement of a contact hole 54. The semiconductor device 100 of the present example has a cross-sectional structure illustrated in FIG. 10. In the present example, a range not covered by the interlayer dielectric film 38 illustrated in FIG. 10 is defined as a range of the contact hole 54. As illustrated in FIG. 11, in a top view, each of the contact holes 54 arranged between each of gate trench sections 40 and each of dummy trench sections 30 is also provided above each dummy trench sections 30. That is, the contact hole 54 is also provided above the contact extension section 58 illustrated in FIG. 10 in addition to above a first mesa section 60. Accordingly, the emitter electrode 52 and the contact extension section 58 are connected.

Figure 12:
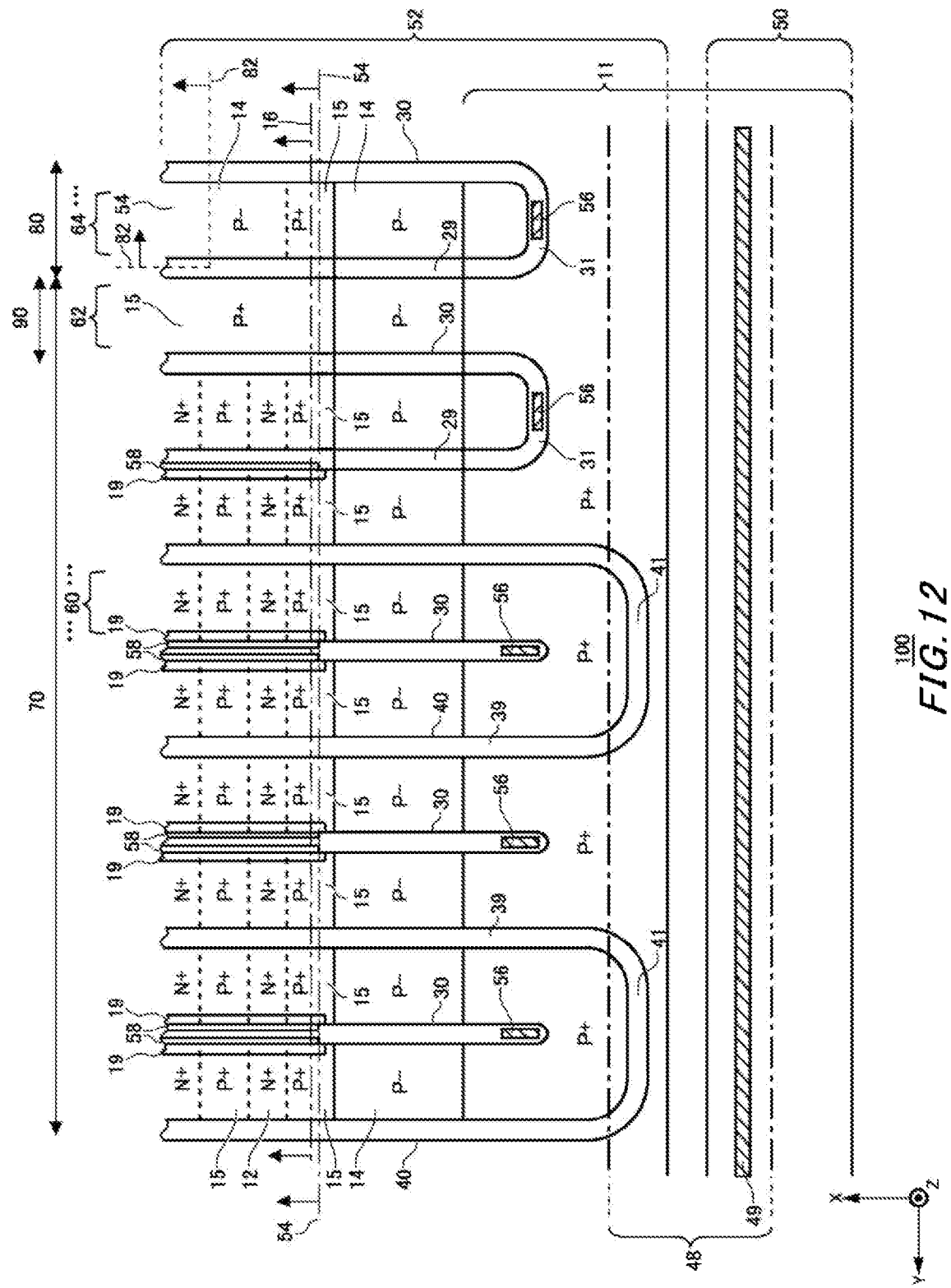
FIG. 12 is a top view illustrating an exemplary arrangement of a high concentration region 19 and a contact extension section 58.

FIG. 12 is a top view illustrating an exemplary arrangement of a high concentration region 19 and a contact extension section 58. In FIG. 12, an end position of the contact hole 54 in the X-axis direction is indicated by an alternate long and short dash line.

The high concentration region 19 extends in the X-axis direction along the dummy trench section 30. In the present example, the emitter region 12 and the contact region 15 extend in the X-axis direction. The high concentration region 19 may be continuous over a range where one or more emitter regions 12 and one or more contact regions 15 are provided in the X-axis direction. The high concentration region 19 may be continuous over a range longer than the contact hole 54 in the X-axis direction.

The high concentration regions 19 may be provided outside an accumulation region 16 in the X-axis direction. The outside in the X-axis direction refers to a side away from the center of a mesa section in the X-axis direction. By providing the high concentration regions 19 to the outside the accumulation region 16, holes outside the accumulation region 16 can be easily extracted via the high concentration region 19. The high concentration regions 19 may extend further to the outside than the contact region 15 arranged at the outermost side in the X-axis direction.

The contact extension sections 58 extend in the X-axis direction along the dummy trench sections 30. The contact extension sections 58 may be continuous in the X-axis direction over a range where one or more emitter regions 12 and one or more contact regions 15 are provided. The contact extension section 58 may be provided in the same range as the contact hole 54 in the X-axis direction. The contact extension section 58 may be provided over a range longer than the contact hole 54 in the X-axis direction or may be provided in a range shorter than the contact hole 54.

The contact extension section 58 may be provided to the outside of the accumulation region 16 in the X-axis direction. By providing the contact extension sections 58 to the outside of the accumulation region 16, holes outside the accumulation region 16 can be easily extracted via the contact extension sections 58. The contact extension sections 58 may be provided in a range shorter than the high concentration regions 19 in the X-axis direction or may be provided in a range longer than the high concentration regions 19.

Figure 13:
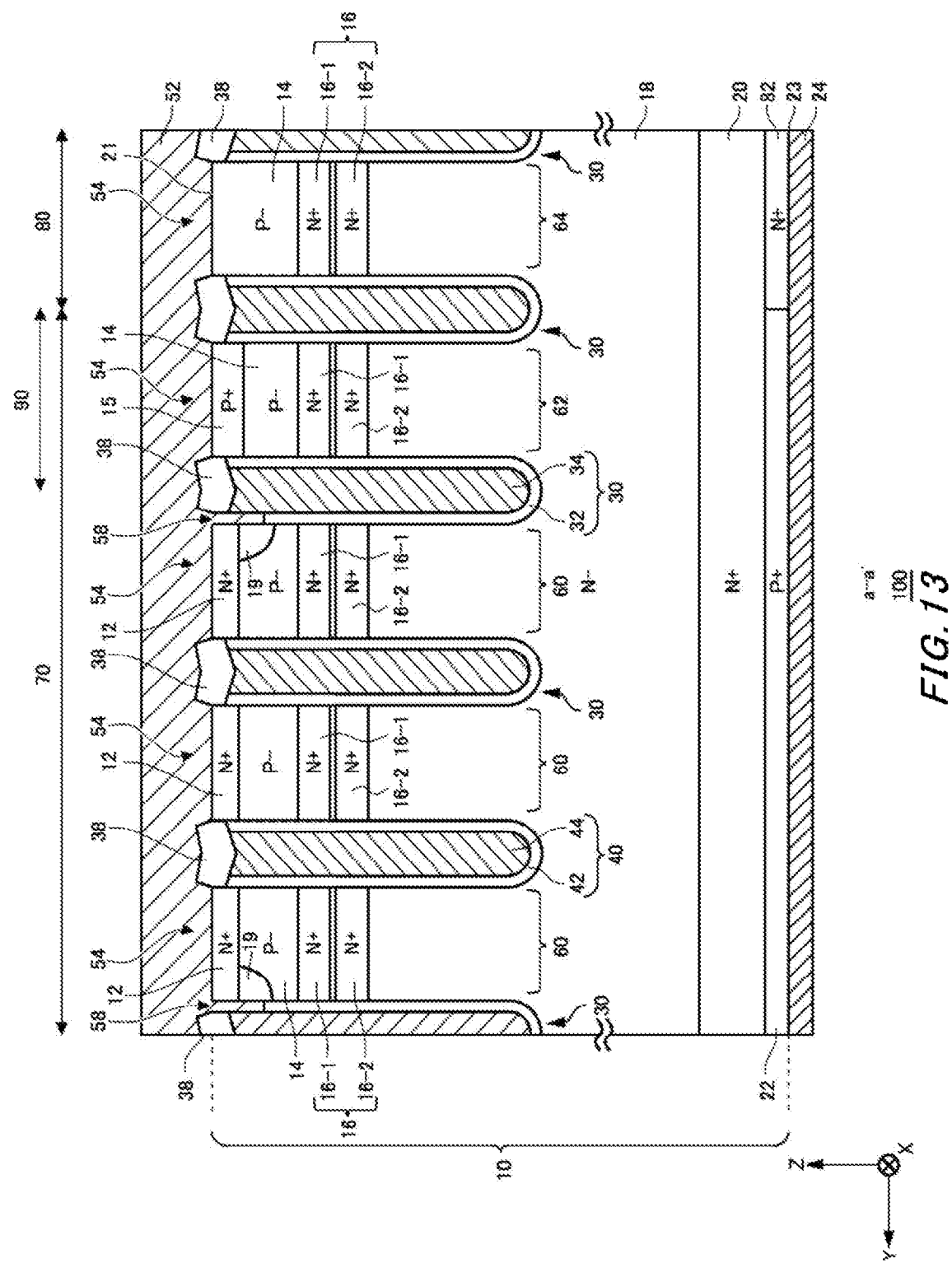
FIG. 13 illustrates one example of a cross section taken along a-a' in FIG. 12.

FIG. 13 illustrates one example of a cross section taken along a-a' in FIG. 12. As described above, the contact extension section 58 is provided on an inner wall of the dummy trench section 30 facing the gate trench section 40. The contact extension section 58 may or may not be provided on an inner wall of a dummy trench section 30 facing another dummy trench section 30. A gate trench section 40 does not include the contact extension section 58.

The high concentration region 19 may be exposed at the side surface of the base region 14 in contact to the contact extension section 58. Such configuration can increase a contact area between the emitter electrode 52, and the emitter region 12, the contact region 15, and the base region 14.

Figure 14:
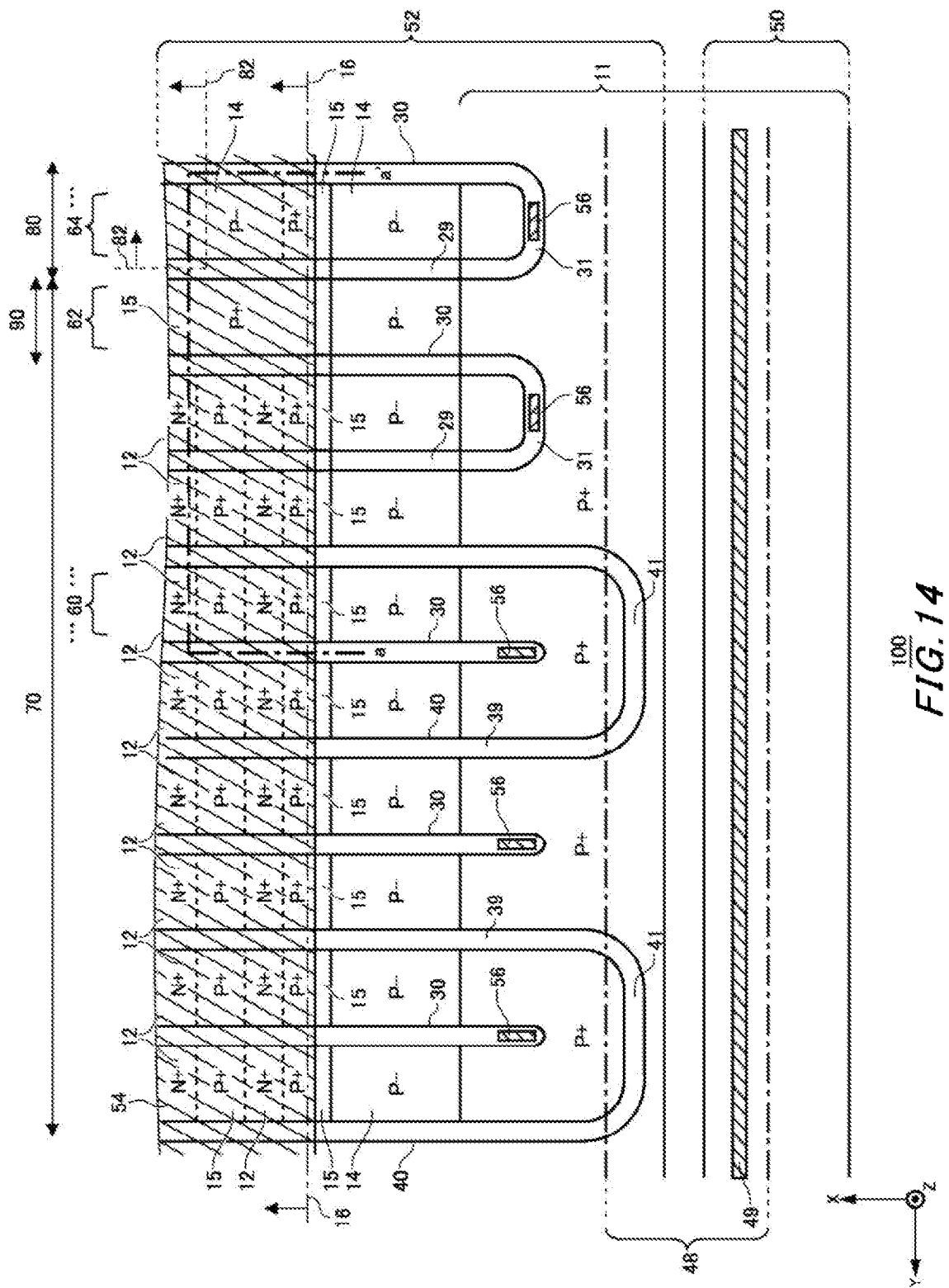
FIG. 14 is a top view illustrating another exemplary arrangement of a contact hole 54.

FIG. 14 is a top view illustrating another exemplary arrangement of a contact hole 54. The contact hole 54 of the present example is provided above each trench section in addition to above each mesa section. The contact holes 54 may be continuous over one or more mesa sections and one or more trench sections in the Y-axis direction. The contact holes 54 may be continuous from the transistor section 70 to the diode section 80. The contact holes 54 of the present example are continuous between mesa sections at both ends in the Y-axis direction. Such configuration can also increase a contact area between a mesa section and the emitter electrode 52.

FIG. 15 illustrates one example of a cross section taken along a-a' in FIG. 14. A semiconductor device 100 of the present example differs from the semiconductor device 100 illustrated in FIG. 1a to FIG. 14 in a structure of an interlayer dielectric film 38. The semiconductor device 100 of the present example may be the same as any one of the semiconductor devices 100 illustrated in FIG. 1a to FIG. 14 except for the structure of the interlayer dielectric film 38.

The entire interlayer dielectric film 38 of the present example is provided inside a trench section. That is, the entire interlayer dielectric film 38 is arranged below an upper surface 21 of a semiconductor substrate 10. An upper end of the interlayer dielectric film 38 may be arranged at the same height as the upper surface 21 or may be arranged below the upper surface 21.

An emitter electrode 52 may also be provided inside a trench section. Tungsten may be filled in a region in a trench section at an upper side than the interlayer dielectric film 38. In the present example, the flatness on the upper surface 21 of the semiconductor substrate 10 is improved because the entire interlayer dielectric film 38 is arranged below the upper surface 21. This allows accurately forming a member above the upper surface 21 of the semiconductor substrate 10 such as the emitter electrode 52.

Figure 16:
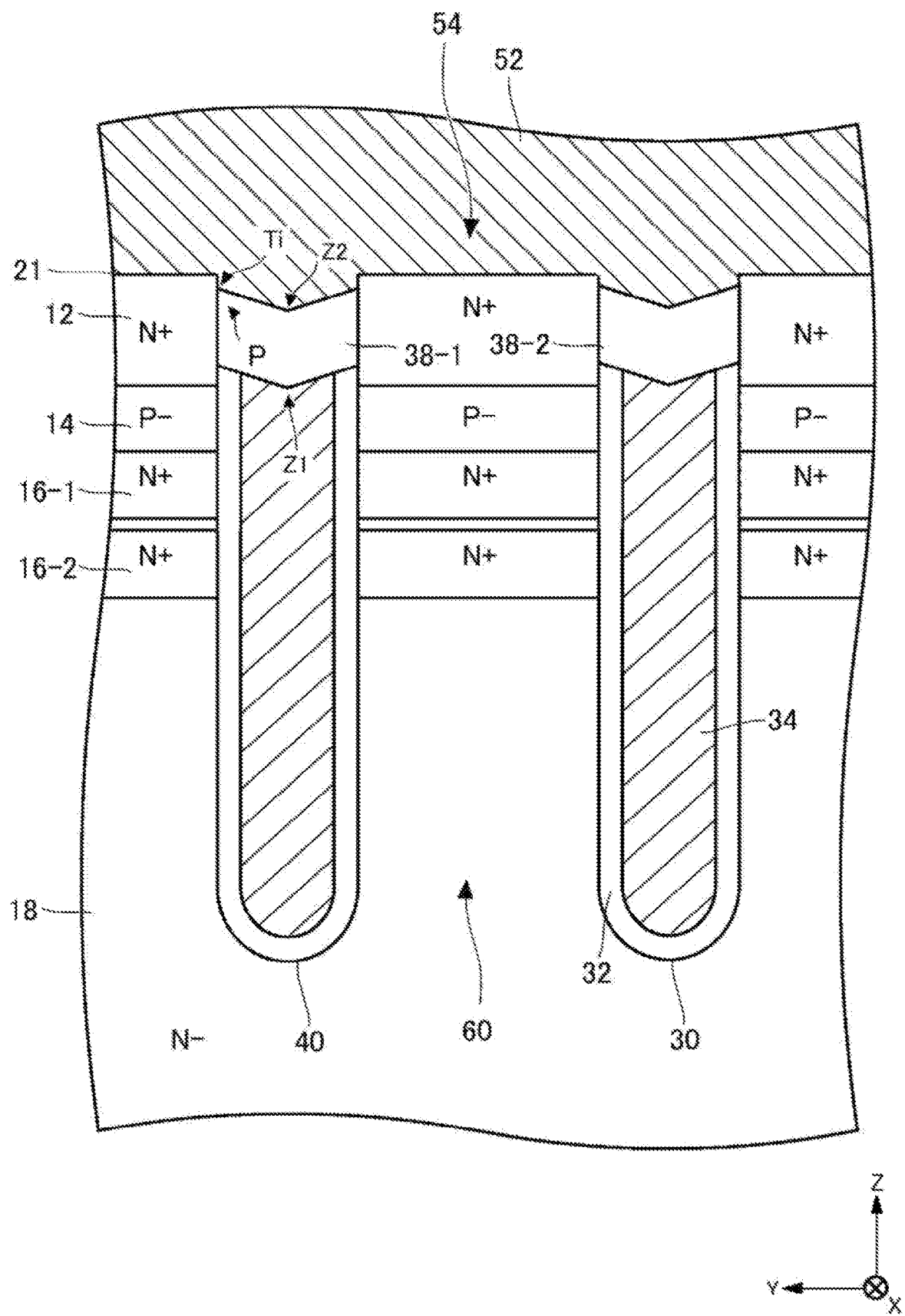
FIG. 16 is an enlarged view of the vicinity of a trench section in FIG. 15.

FIG. 16 is an enlarged view of the vicinity of a trench section in FIG. 15. An upper end Ti of an interlayer dielectric film 38 may be arranged below an upper surface 21 of a semiconductor substrate 10 or may be arranged at the same height as the upper surface 21. An upper surface of the interlayer dielectric film 38 has a lower end Z2 at the center in the Y-axis direction. Such structure can suppress the interlayer dielectric film 38 from protruding above the upper surface 21 of the semiconductor substrate 10. Therefore, the flatness on the upper surface 21 of the semiconductor substrate 10 can be improved.

Figure 17:
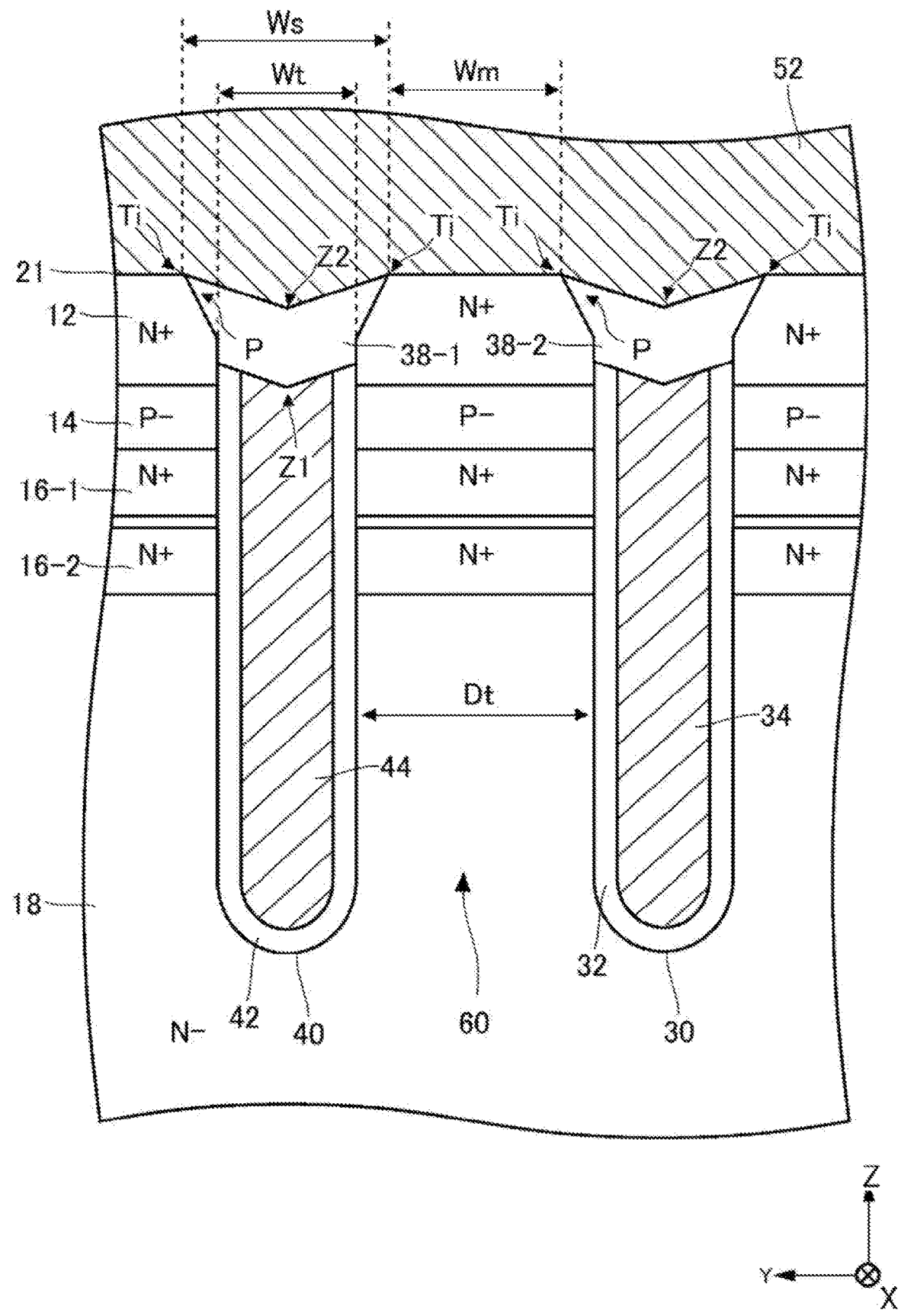
FIG. 17 illustrates another example of a structure of an interlayer dielectric film 38.

FIG. 17 illustrates another example of a structure of an interlayer dielectric film 38. The interlayer dielectric film 38 of the present example is also arranged below the upper surface 21 of the semiconductor substrate 10 as in an example of FIG. 16. In the present example, the interlayer dielectric film 38 is tapered such that it widens in the Y-axis direction as it gets close to the upper surface 21 of the semiconductor substrate 10. That is, a width Ws at an upper end of the interlayer dielectric film 38 is larger than a width Wt of a trench section. The width Ws of the present example is a distance between two vertices Ti of the interlayer dielectric film 38.

In the present example, a first mesa section 60 is tapered such that it becomes narrow in the Y-axis direction as it gets close to the upper surface 21. Another mesa section may have the same structure as the first mesa section 60. A width Wm of a mesa section on the upper surface 21 is smaller than a distance Dt between two trench sections. In the present example, a gate conductive section 44 and an emitter electrode 52 can be more reliably insulated from each other.

Figure 18:
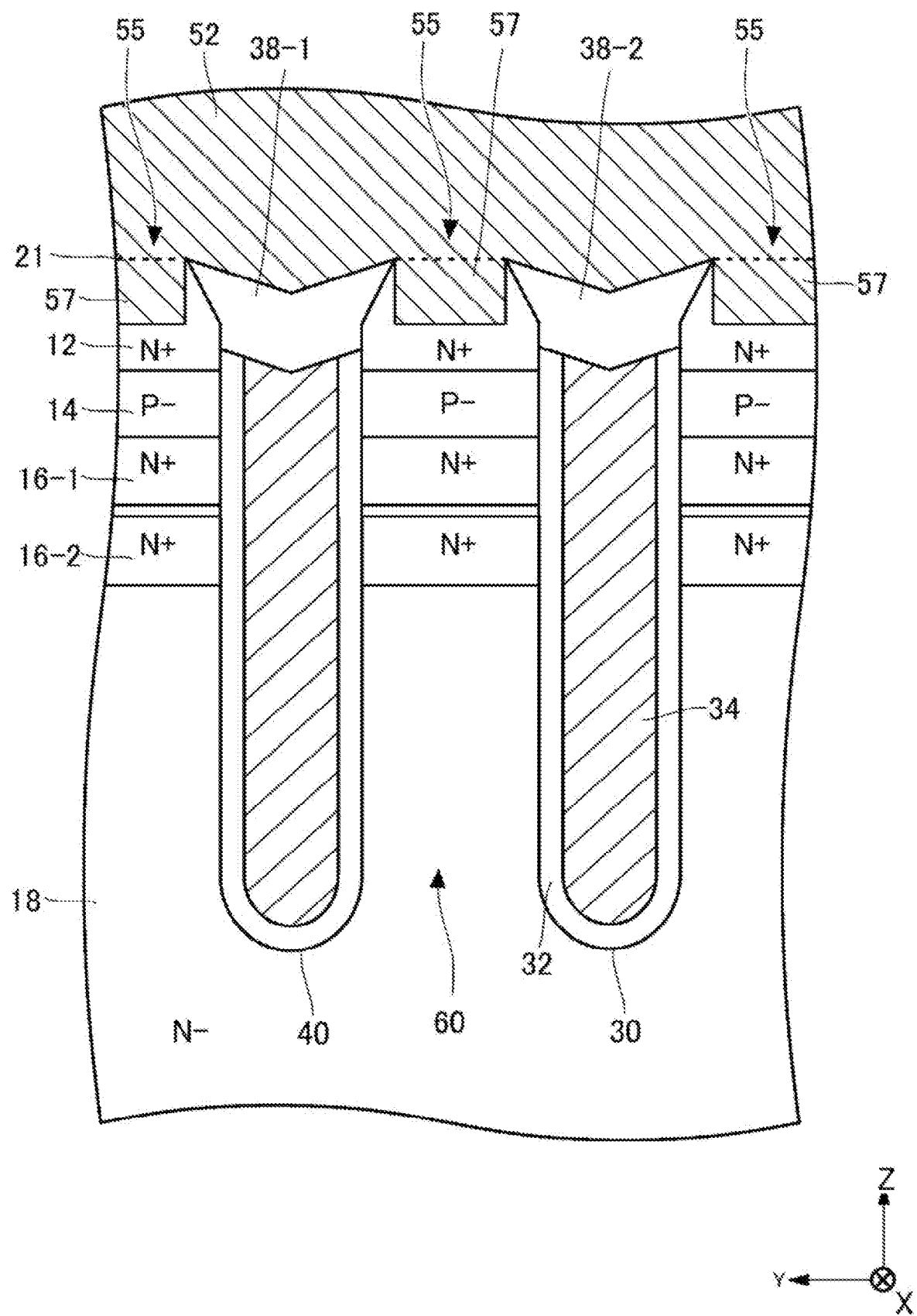
FIG. 18 illustrates another example of a structure of a mesa section.

FIG. 18 illustrates another example of a structure of a mesa section. Although a first mesa section 60 is described as an example in the present example, another mesa section may have a similar structure. A trench contact 57 made of a conductive material is provided on an upper surface of the first mesa section 60 (that is, the upper surface 21 of the semiconductor substrate 10 in the first mesa section 60).

The trench contact 57 is connected to an emitter electrode 52. The trench contact 57 may be a part of the emitter electrode 52. That is, the trench contact 57 may be formed of the same material as the emitter electrode 52. In another example, at least a part of the trench contact 57 may be formed of tungsten. The trench contact 57 may include a barrier metal.

The trench contact 57 is embedded in the emitter region 12 from the upper surface 21. The trench contact 57 of the present example does not reach a base region 14.

The trench contact 57 is arranged between two interlayer dielectric films 38 on the upper surface 21. The trench contact 57 may be in contact to or may be away from the interlayer dielectric film 38 on the upper surface 21.

Provision of the trench contact 57 can increase a contact area between the emitter region 12 and the emitter electrode 52. Therefore, even if a width of a first mesa section 60 is reduced, an increase in a contact resistance between the emitter region 12 and the emitter electrode 52 can be suppressed.

Figure 19:
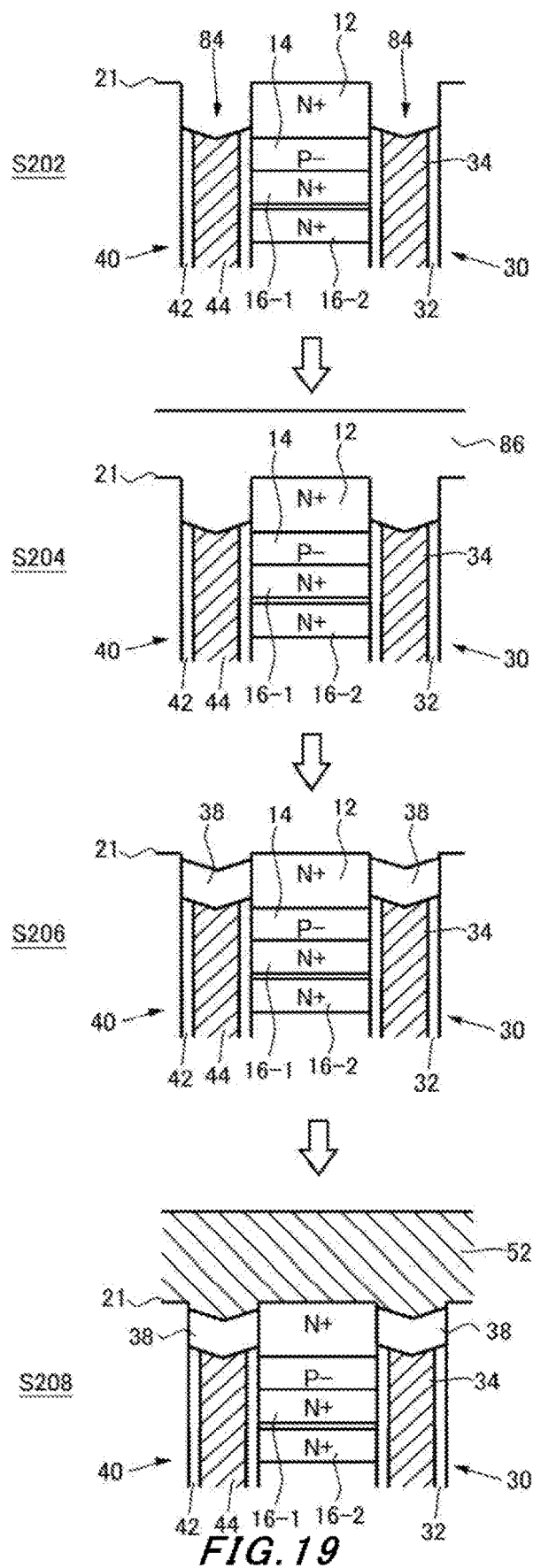
FIG. 19 illustrates one example of a manufacturing process of an interlayer dielectric film 38 illustrated in FIG. 15.

FIG. 19 illustrates one example of a manufacturing process of an interlayer dielectric film 38 illustrated in FIG. 15. In the present example, before step S202, each trench section and doping regions such as an emitter region 12 and a base region 14 are formed on a semiconductor substrate 10. An insulating film and a conductive section are filled in each trench section up to the height of the upper surface 21 of the semiconductor substrate 10.

In step S202, upper portions of the insulating film and the conductive section in each trench section are etched. This forms a space 84 at an upper end of each trench section. The space 84 is formed above a lower end of the emitter region 12. That is, the emitter region 12 is formed up to a relatively deep position so as to be present below the space 84.

In step S204, an insulating material 86 such as a BPSG is formed on the upper surface 21 of the semiconductor substrate 10. The insulating material 86 fills at least the space 84.

In step S206, the insulating material 86 is removed by methods such as the CMP and dry etching. In step S206, all of the insulating materials 86 above the upper surface 21 are removed by etching an entire surface of the insulating material 86 provided on the upper surface 21. In step S206, a part of the insulating material 86 in each trench section may be selectively removed after removing the insulating material 86 above the upper surface 21. In step S206, the interlayer dielectric film 38 arranged in each trench section is formed.

In step S208, the emitter electrode 52 is formed on the upper surface 21 of the semiconductor substrate 10. The barrier metal may be formed before forming the emitter electrode 52. This can form the interlayer dielectric film 38 illustrated in FIG. 15.

A thickness of the interlayer dielectric film 38 in the depth direction can be increased by increasing a depth of the space 84 in step S202. The depth of the space 84 and the depth of the emitter region 12 are adjusted depending on the thickness of the interlayer dielectric film 38.

Figure 20:
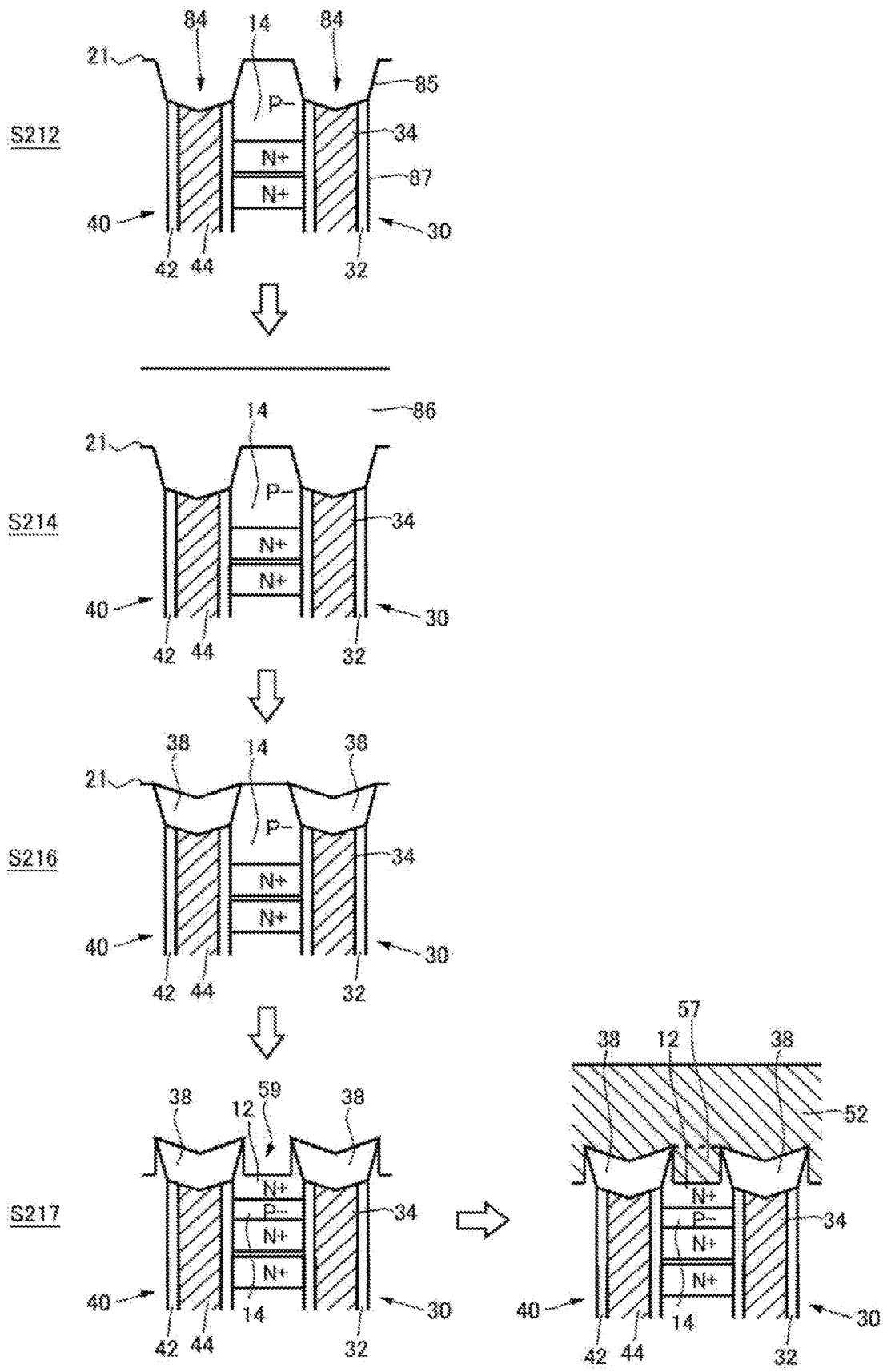
FIG. 20 illustrates one example of a manufacturing process of an interlayer dielectric film 38 illustrated in FIG. 18.

FIG. 20 illustrates one example of a manufacturing process of an interlayer dielectric film 38 illustrated in FIG. 18. In the present example, before step S212, each trench section and a doping region such as a base region 14 are formed on the semiconductor substrate 10. However, the emitter region 12 is not formed. An insulating film and a conductive section are filled in each trench section up to the height of the upper surface 21 of the semiconductor substrate 10.

In step S212, upper portions of the insulating film and the conductive section in each trench section are etched. This causes the space 84 to be formed at an upper end of each trench section. The space 84 is tapered such that it widens in the Y-axis direction as it gets close to the upper surface 21. A tilt of an inner wall 85 of the space 84 relative to the upper surface 21 is smaller than a tilt of an inner wall 87 of a trench section relative to the upper surface 21. The space 84 may be formed by wet etching or the like.

In step S214, an insulating material 86 such as a BPSG is formed on the upper surface 21 of the semiconductor substrate 10. The insulating material 86 fills at least the space 84.

In step S216, the insulating material 86 is removed. A process in step S216 is the same as a process in step S206. In step S216, the interlayer dielectric film 38 formed in a trench section is arranged.

In step S217, a contact trench 59 is formed on an upper surface of a first mesa section 60. The contact trench 59 may be formed by dry etching or the like. The contact trench 59 may be formed above an upper end of a gate conductive section 44. In step S217, an emitter region 12 is formed. The emitter region 12 may be formed by implanting N-type impurities from an upper surface of the first mesa section 60 after forming the contact trench 59. This allows forming the emitter region 12 below the contact trench 59. The emitter region 12 may be formed before the contact trench 59 is provided.

In step S218, a trench contact 57 and an emitter electrode 52 are formed. The trench contact 57 is formed inside the contact trench 59. The trench contact 57 and the emitter electrode 52 may be formed of the same material in the same process. In another example, the emitter electrode 52 made of a material different from the trench contact 57 may be formed after forming the trench contact 57. The barrier metal may be formed before forming the trench contact 57. This allows forming the interlayer dielectric film 38 illustrated in FIG. 18.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, the specification, or diagrams can be performed in any order as long as the order is not indicated by "prior to," "before," or the like and as long as the output from a previous process is not used in a later process. Even if the process flow is described using phrases such as "first" or "next" in the claims, the specification or diagrams, it does not necessarily mean that the process must be performed in this order.

EXPLANATION OF REFERENCES

10: semiconductor substrate, 11: well region, 12: emitter region, 14: base region, 15: contact region, 16: accumulation region, 16-1: accumulation region, 16-2: accumulation region, 18: drift region, 19: high concentration region, 20: buffer region, 21: upper surface, 22: collector region, 23: lower surface, 24: collector electrode, 29: extending portion, 30: dummy trench section, 31: connecting portion, 32: dummy insulating film, 33: upper end, 34: dummy conductive section, 35: upper portion, 36: lower portion, 37: side surface, 38: interlayer dielectric film, 39: extending portion, 40: gate trench section, 41: connecting portion, 42: gate insulating film, 44: gate conductive section, 48: gate runner, 49: contact hole, 50: gate metal layer, 52: emitter electrode, 54: contact hole, 55: contact hole, 56: contact hole, 57: trench contact, 58: contact extension section, 59: contact trench, 60: first mesa section, 62: second mesa section, 64: third mesa section, 70: transistor section, 72: side surface, 74: inner wall, 76: side surface, 80: diode section, 82: cathode region, 84: space, 85: inner wall, 86: insulating material, 87: inner wall, 90: boundary portion, 92: guard ring, 94: field plate, 98: barrier metal, 100: semiconductor device, 116: gate pad, 118: emitter pad, 120: active section, 122: edge termination structure section, 140: periphery, 150: semiconductor device, 174: channel stopper, 200: semiconductor chip, 238: interlayer dielectric film, 254: contact hole

What is claimed is:

1. A semiconductor device comprising: a semiconductor substrate; a gate trench section that is provided from an upper surface to an inside of the semiconductor substrate and extends in a predetermined extending direction on the upper surface of the semiconductor substrate; a mesa section in contact to the gate trench section in an arrangement direction orthogonal the extending direction; and an interlayer dielectric film provided above the semiconductor substrate; wherein the interlayer dielectric film is provided above at least a part of the gate trench section in the arrangement direction; a contact hole through which the mesa section is exposed is provided to the interlayer dielectric film; and a width of the contact hole in the arrangement direction is greater than a width of the mesa section in the arrangement direction.

2. The semiconductor device according to claim 1, wherein
the gate trench section includes:
a gate insulating film provided on an inner wall of the gate trench section; and
a gate conductive section surrounded by the gate insulating film inside the gate trench section,
an upper end of the gate conductive section is arranged below the upper surface of the semiconductor substrate, and
the interlayer dielectric film is provided above at least a part of the gate conductive section in the arrangement direction.

3. The semiconductor device according to claim 2, wherein
the interlayer dielectric film is provided from a first end to a second end of the gate trench section in the arrangement direction.

4. The semiconductor device according to claim 2, wherein
a lower portion of the interlayer dielectric film is thicker than an upper portion of the interlayer dielectric film, the lower portion being provided below the upper surface of the semiconductor substrate, and the upper portion being provided above the upper surface of the semiconductor substrate.

5. The semiconductor device according to claim 2, wherein
above the upper surface of the semiconductor substrate, an angle formed between a side surface arranged at an end of the interlayer dielectric film in the arrangement direction and the upper surface of the semiconductor substrate is 20 degrees or larger and 60 degrees or smaller.

6. The semiconductor device according to claim 2, wherein
a thickness of the interlayer dielectric film above the upper surface of the semiconductor substrate is two times or more and four times or less of a thickness of the gate insulating film.

7. The semiconductor device according to claim 2, wherein
at above the upper surface of the semiconductor substrate, the interlayer dielectric film includes a convex part that is convex upward.

8. The semiconductor device according to claim 7, wherein
a vertex of the convex part is arranged above the gate insulating film in a direction orthogonal to the upper surface of the semiconductor substrate.

9. The semiconductor device according to claim 7, wherein
a vertex of the convex part is arranged above the gate conductive section in a direction orthogonal to the upper surface of the semiconductor substrate.

10. The semiconductor device according to claim 2, wherein
the interlayer dielectric film includes a depression on an upper surface of an upper portion provided above the upper surface of the semiconductor substrate and in a region not including a center of the interlayer dielectric film in the arrangement direction.

11. The semiconductor device according to claim 10, wherein
the depression is arranged above the gate conductive section in a direction orthogonal to the upper surface of the semiconductor substrate.

12. The semiconductor device according to claim 2, wherein
the contact hole is continuous in the arrangement direction above the mesa section and above the gate conductive section.

13. The semiconductor device according to claim 1, further comprising:
a dummy trench section that is provided from the upper surface to the inside of the semiconductor substrate, extends in a predetermined extending direction on the upper surface of the semiconductor substrate, and faces the gate trench section in an arrangement direction orthogonal to the extending direction; and
a contact extension section formed of a conductive material, wherein
the dummy trench section includes:
a dummy insulating film provided on an inner wall of the dummy trench section; and a dummy conductive section surrounded by the dummy insulating film inside the dummy trench section,
an upper end of the dummy insulating film provided between a part of the inner wall of the dummy trench section facing the gate trench section and the dummy conductive section is arranged below an upper end of the dummy conductive section; and
the contact extension section is in contact to the upper end of the dummy insulating film.

14. The semiconductor device according to claim 1, wherein
the interlayer dielectric film is provided below the upper surface of the semiconductor substrate inside the gate trench section.

15. The semiconductor device according to claim 14, wherein
a width of the interlayer dielectric film in the arrangement direction increases as a distance between the interlayer dielectric film and the upper surface of the semiconductor substrate becomes short.

16. The semiconductor device according to claim 15, wherein
a width of the mesa section decreases in the arrangement direction as a distance between the mesa section and the upper surface of the semiconductor substrate becomes short.

17. The semiconductor device according to claim 16, wherein
a trench contact made of a conductive material is provided on an upper surface of the mesa section.

18. The semiconductor device according to claim 1, wherein
the gate trench section includes:
a gate insulating film provided on an inner wall of the gate trench section; and
a gate conductive section surrounded by the gate insulating film inside the gate trench section; and
the interlayer dielectric film is provided above the gate insulating film.

19. The semiconductor device according to claim 1, wherein
an emitter region in contact to the gate trench section is provided on an upper surface of the mesa section; and
the interlayer dielectric film is not arranged above the emitter region.

20. The semiconductor device according to claim 17, wherein
an emitter region in contact to the gate trench section is provided on an upper surface of the mesa section; and
the emitter region is provided below the trench contact.

* * * * *